United States Patent
Tsai et al.

(10) Patent No.: US 9,633,917 B2
(45) Date of Patent: Apr. 25, 2017

(54) THREE DIMENSIONAL INTEGRATED CIRCUIT STRUCTURE AND METHOD OF MANUFACTURING THE SAME

(71) Applicant: Taiwan Semiconductor Manufacturing Co., Ltd., Hsin-Chu (TW)

(72) Inventors: Wen-Ching Tsai, Hsinchu (TW); Ming-Fa Chen, Taichung (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/830,740

(22) Filed: Aug. 20, 2015

(65) Prior Publication Data

US 2017/0053844 A1 Feb. 23, 2017

(51) Int. Cl.
*H01L 25/065* (2006.01)
*H01L 21/66* (2006.01)
*H01L 23/31* (2006.01)
*H01L 23/538* (2006.01)
*H01L 23/00* (2006.01)
(Continued)

(52) U.S. Cl.
CPC ............ *H01L 22/32* (2013.01); *H01L 21/563* (2013.01); *H01L 21/82* (2013.01); *H01L 22/14* (2013.01); *H01L 23/3171* (2013.01); *H01L 23/538* (2013.01); *H01L 23/5384* (2013.01); *H01L 24/03* (2013.01); *H01L 24/09* (2013.01); *H01L 25/0655* (2013.01); *H01L 25/0657* (2013.01); *H01L 25/50* (2013.01); *H01L 2224/0236* (2013.01); *H01L 2224/02372* (2013.01);
(Continued)

(58) Field of Classification Search
CPC ............................ H01L 21/4814; H01L 24/15
See application file for complete search history.

(56) References Cited

U.S. PATENT DOCUMENTS 8,563,403 B1 10/2013 Farooq et al.
2007/0096263 A1 5/2007 Furukawa et al.
(Continued)

FOREIGN PATENT DOCUMENTS

JP 2006522461 9/2006
TW 200828465 7/2008
(Continued)

OTHER PUBLICATIONS

"Office Action of Deutsches Counterpart Application," issued on Jan. 28, 2016, p. 1-p. 7, in which the listed references were cited.
(Continued)

*Primary Examiner* — Cheung Lee
(74) *Attorney, Agent, or Firm* — Jianq Chyun IP Office

(57) ABSTRACT

Provided is a three dimensional integrated circuit structure including a first die, a through substrate via and a connector. The first die is bonded to a second die with a first dielectric layer of the first die and a second dielectric layer of the second die, wherein a first passivation layer is between the first dielectric layer and a first substrate of the first die, and a first test pad is embedded in the first passivation layer. The through substrate via penetrates through the first die and is electrically connected to the second die. The connector is electrically connected to the first die and the second die through the through substrate via.

19 Claims, 28 Drawing Sheets

(51) Int. Cl.
*H01L 25/00* (2006.01)
*H01L 21/56* (2006.01)
*H01L 21/82* (2006.01)

(52) U.S. Cl.
CPC ............... *H01L 2224/08235* (2013.01); *H01L 2924/37001* (2013.01)

(56) References Cited

U.S. PATENT DOCUMENTS

| | | |
|---|---|---|
| 2009/0042365 A1 | 2/2009 | McDonald |
| 2012/0193785 A1 | 8/2012 | Lin et al. |
| 2013/0285056 A1 | 10/2013 | Pagani et al. |
| 2014/0063887 A1 | 3/2014 | Vogelsang |
| 2015/0123284 A1 | 5/2015 | Jo et al. |
| 2015/0206846 A1 | 7/2015 | Lo et al. |

FOREIGN PATENT DOCUMENTS

| | | |
|---|---|---|
| TW | 201530694 | 8/2015 |
| WO | 2004059720 | 7/2004 |

OTHER PUBLICATIONS

"Office Action of Taiwan Counterpart Application", issued on Aug. 3, 2016, p. 1-p. 4, in which the listed references were cited.

THREE DIMENSIONAL INTEGRATED CIRCUIT STRUCTURE AND METHOD OF MANUFACTURING THE SAME

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Exemplary types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

DETAILED DESCRIPTION

Figure 1A:
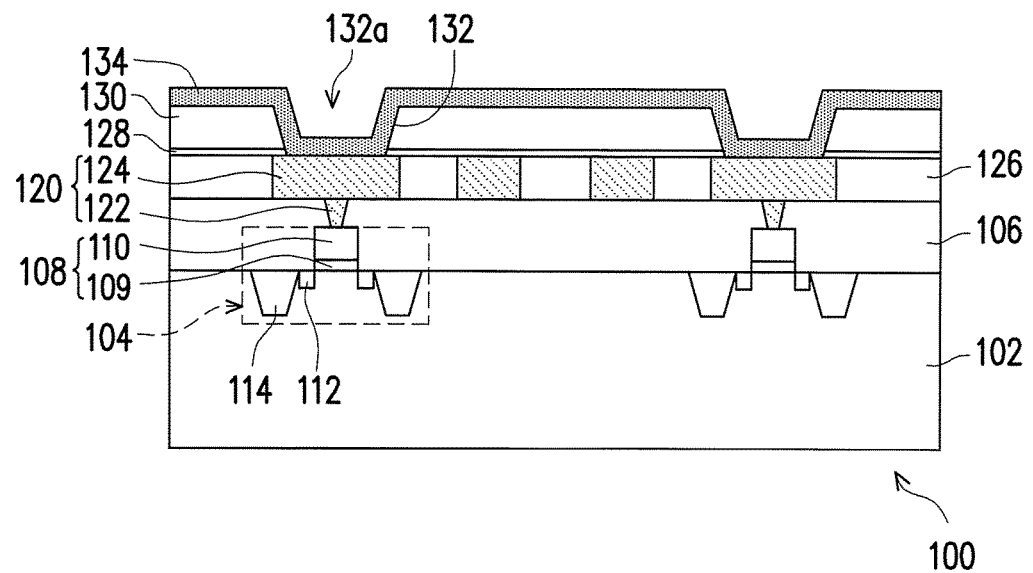
FIG. 1A to FIG. 1K are schematic cross-sectional views illustrating a manufacturing method of a three dimensional integrated circuit (3DIC) structure in accordance with first embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 6:
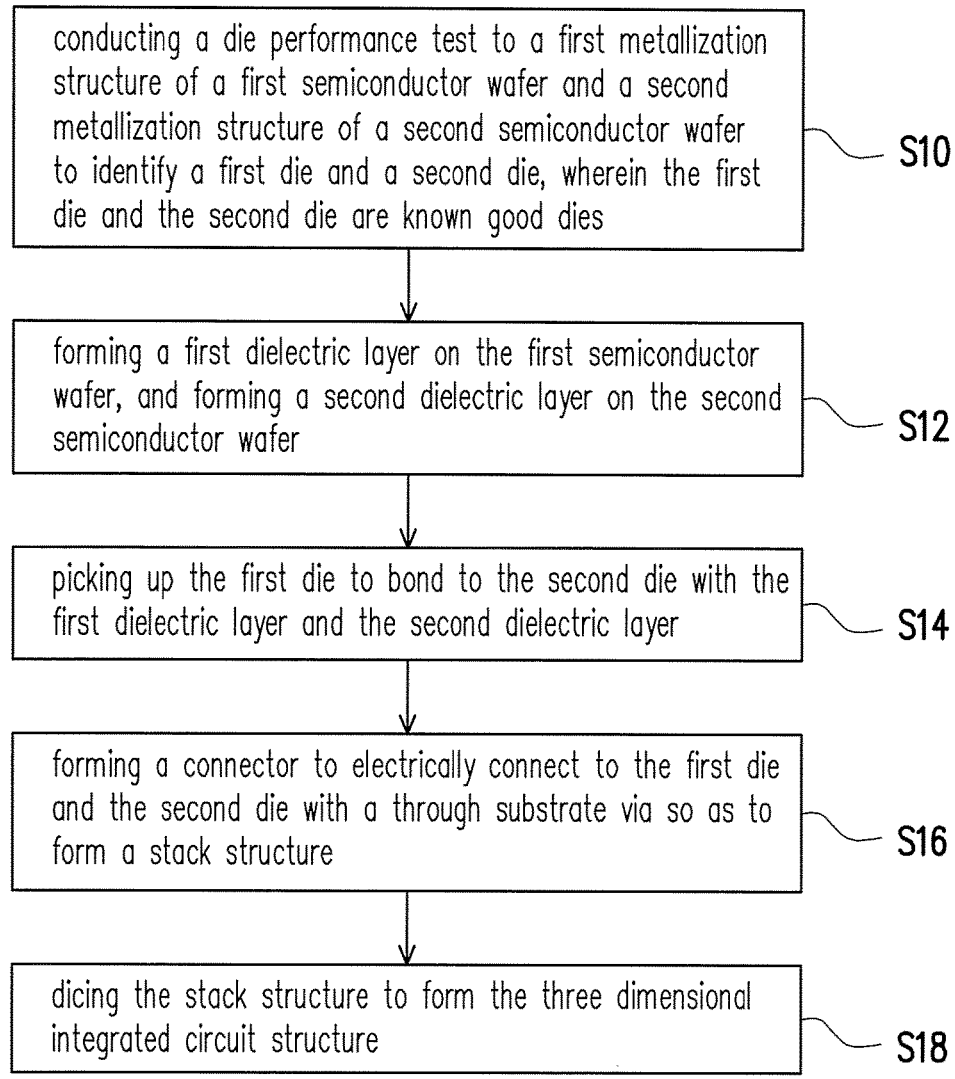
FIG. 6 is a flow chart illustrating a method of manufacturing a 3DIC structure in accordance with some embodiments.

FIG. 1A to FIG. 1K are schematic cross-sectional views illustrating a manufacturing method of a three dimensional integrated circuit (3DIC) structure in accordance with the first embodiments. FIG. 6 is a flow chart illustrating a method of manufacturing a 3DIC structure in accordance with some embodiments.

Referring to FIG. 1A, a first semiconductor wafer 100 is provided. The first semiconductor wafer 100 includes a first substrate 102, which may be made of silicon or other semiconductor materials. Alternatively or additionally, the first substrate 102 may include other elementary semiconductor materials such as germanium. In some embodiments, the first substrate 102 is made of a compound semiconductor such as silicon carbide, gallium arsenic, indium arsenide, or indium phosphide. In some embodiments, the first substrate 102 is made of an alloy semiconductor such as silicon germanium, silicon germanium phosphide. In some embodiments, the first substrate 102 includes an epitaxial layer. For example, the first substrate 102 has an epitaxial layer overlying a bulk semiconductor.

Referring to FIG. 1A, first device regions 104 are formed in the first semiconductor wafer 100 in a front-end-of-line (FEOL) process in some embodiments. One of the first device regions 104 includes a gate structure 108, source/drain regions 112, and isolation structures 114, such as shallow trench isolation (STI) structures. The gate structure 108 includes a gate dielectric layer 109, a gate electrode 110, and possibly spacers (not shown). The gate dielectric layer 109 is made of silicon oxide, a high dielectric constant (high-k) material or a combination thereof, for example. In some embodiments, the high-k material has a dielectric constant of greater than about 4 or even greater than about 10. In some embodiments, the high-k material includes metal oxide, such as titanium oxide ($TiO_2$), zirconium oxide ($ZrO_2$), hafnium oxide ($HfO_2$), tantalum oxide ($Ta_2O_5$), and barium and strontium titanium oxide (($Ba,Sr)TiO_3$) or a combination thereof. In some embodiments, the gate electrode 110 is a metal gate including metal, metal alloy, metal silicide or a combination thereof. In alternative embodiments, the gate electrode 110 is a polysilicon gate. The source/drain regions 112 include epitaxial layers (e.g., SiGe or SiC) and/or doped regions therein. The first device regions 104 shown in FIG. 1A are merely examples, and other structures may be formed in the first device regions 104.

The first device regions 104 may form various N-type metal-oxide semiconductor (NMOS) and/or P-type metal-oxide semiconductor (PMOS) devices, such as transistors or memories, and the like, which are interconnected to perform one or more functions. Other devices, such as capacitors, resistors diodes, photo-diodes, fuses, and the like may also be formed on the first substrate 102.

Referring to FIG. 1A, a dielectric layer 106 is formed aside and over the first device regions 104. The dielectric layer 106 includes silicon oxide, silicon nitride, silicon oxynitride, or a low dielectric constant (low-k) material with a dielectric constant lower than 4, for example. In some embodiments, the dielectric layer 106 is made of silicon oxide. A method of forming the dielectric layer 106 includes, for example, chemical vapor deposition (CVD), physically vapor deposition (PVD) process and/or the like.

A first interconnection 120 is formed over the first device regions 104 to electrically connect to the first device regions 104. In some embodiments, the first interconnection 120 includes contact plugs 122 and conductive lines 124 in or on the dielectric layer 106.

The conductive lines 124 are embedded in a first insulating layer 126. The contact plugs 122 and the conductive lines 124 include copper, copper alloys, nickel, aluminum, tungsten, a combination of thereof or the like, for example. In some embodiments, the contact plugs 122 are made of tungsten and the conductive lines 124 are made of copper. In some embodiments, forming the contact plugs 122 and the conductive lines 124 comprises patterning the dielectric layer, forming plugs and a metal layer in or on the dielectric layer 106. In alternative embodiments, the contact plugs 122 and the conductive lines 124 may be formed by, for example, a dual damascene process.

In some embodiments, a barrier layer (not shown) may be formed between the contact plugs 122 and the dielectric layer 106 or between the conductive lines 124 and the first insulating layer 126 to prevent the material of the contact plugs 122 or the conductive lines 124 from migrating to the first device regions 104. A material of the barrier layer includes tantalum, tantalum nitride, titanium, titanium nitride, cobalt-tungsten (CoW) or a combination thereof, for example. A method of forming the barrier layer includes, for example, CVD, PVD and/or the like.

The first insulating layer 126 includes a low dielectric constant (low-k) material, a nitride such as silicon nitride, an oxide such as silicon oxide, undoped silicate glass (USG), phosphosilicate glass (PSG), borosilicate glass (BSG), boron-doped phosphosilicate glass (BPSG), or a combination thereof. In some embodiments, the low-k material has a dielectric constant of less than about 4 or even less than about 3. In some embodiments, the low-k material includes a polymer based material, such as benzocyclobutene (BCB), FLARE®, or SILK®; or a silicon dioxide based material, such as hydrogen silsesquioxane (HSQ) or SiOF. In some embodiments, one or more of the first insulating layer 126 include multiple dielectric materials. Each of the first insulating layer 126 is formed by a suitable process such as spin-coating, CVD and/or the like.

The first interconnection 120 shown in merely for illustrative purposes. The first interconnection 120 may include other configurations and may include one or more conductive lines and via layers. Referring to FIG. 1A, the conductive lines 124 refer to the top conductive lines which may be connected to test pads formed in the following steps.

Thereafter, a first passivation layer 130 is formed over the first insulating layer 126 and the conductive lines 124. In some embodiments, the first passivation layer 130 includes silicon oxide, silicon nitride, benzocyclobutene (BCB) polymer, polyimide (PI), polybenzoxazole (PBO) or a combination thereof and is formed by a suitable process such as spin coating, CVD or the like In some embodiments, a thickness of the first passivation layer 130 is in a range from 6000 angstroms to 10000 angstroms. The first passivation layer 130 has openings 132 therein. In some embodiments, the openings 132 are formed by performing a photolithography process and an etching process. The etching process is a dry etching process, such as a reactive ion etching process, or the like.

In some embodiments, before forming the first passivation layer 130, a cap layer 128 is optionally formed over the first insulating layer 126 and the conductive lines 124. In some embodiments, the material of the cap layer 128 may be different from the material of the first passivation layer 130. In alternative embodiments, the material of the cap layer 128 may be the same as the material of the first passivation layer 130. The cap layer 128 is made of, for example, silicon nitride, silicon oxide, silicon oxynitride, or the like. In some embodiments, the first passivation layer 130 is made of silicon oxide, and the cap layer 128 is made of silicon nitride. During the etching process is performed to form the openings 132, portions of the cap layer 128 over the conductive lines 124 are also removed to expose the portion of top surfaces of the conductive lines 124.

Referring to FIG. 1A, a first conductive material layer 134 is formed overlying the first passivation layer 130 and the conductive lines 124. The first conductive material layer 134 can be a metal material layer. The openings 132 are not fully filled with the first conductive material layer 134. In some embodiments, the first conductive material layer 134 is conformally formed overlying the first passivation layer 130 and the conductive lines 124 and recesses 132a are formed over the conductive lines 124 in the openings 132. In some embodiments, a thickness of the first conductive material layer 134 is in a range from 2000 angstroms to 6000 angstroms. A material of the first conductive material layer 134 is different from the material of the conductive lines 124. In some embodiments, the material of the first conductive material layer 134 is softer than the material of the first interconnection 120. The first conductive material layer 134 includes aluminum, copper, nickel, gold, silver, tungsten, a combination of the foregoing, or the like, for example. In some embodiments, the first interconnection 120 is made of copper or copper alloys, and the first conductive material layer 134 is made of aluminum. A method of forming the first conductive material layer 134 includes, for example, electro-chemical plating process, CVD, PECVD, atomic layer deposition (ALD), PVD, a combination of the foregoing, or the like.

Figure 1B:
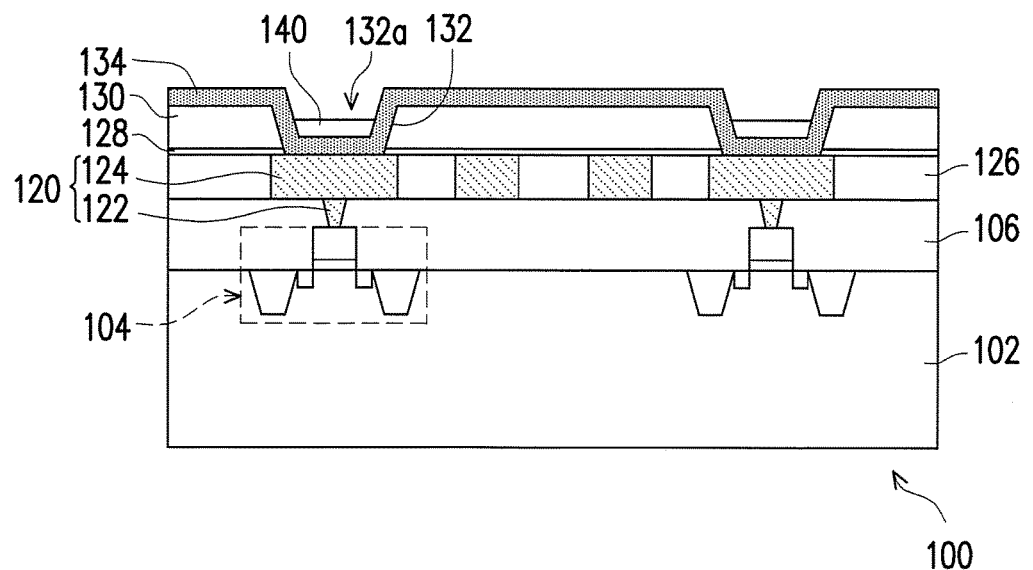

Referring to FIG. 1B, masks 140 are formed overlying a top surface of the first conductive material layer 134 in the recesses 132a. In some embodiments, a top surface of the masks 140 in the recesses 132a is lower than a top surface of the first passivation layer 130. A material of the masks 140 is different from the material of the first conductive material layer 134. The masks 140 may be formed of a flowable material, for example. In some embodiments, the masks 140 may be a photoresist, spin-on glass (SOG) or the like. In some embodiments, a method of forming the masks 140 includes, for example, spin-coating, deposition, or the like. For example, a mask material (not shown) is applied to the surface of the first conductive material layer 134 by spin-coating method first. Then, the mask material on the surface of the first conductive material layer 134 except in the recesses 132a may be removed by etching back, for example. After that, the mask material remaining in the recesses 132a is formed as the masks 140 and a top surface of the masks 140 in the recesses 132a is lower than a top surface of the first passivation layer 130.

Figure 1C:
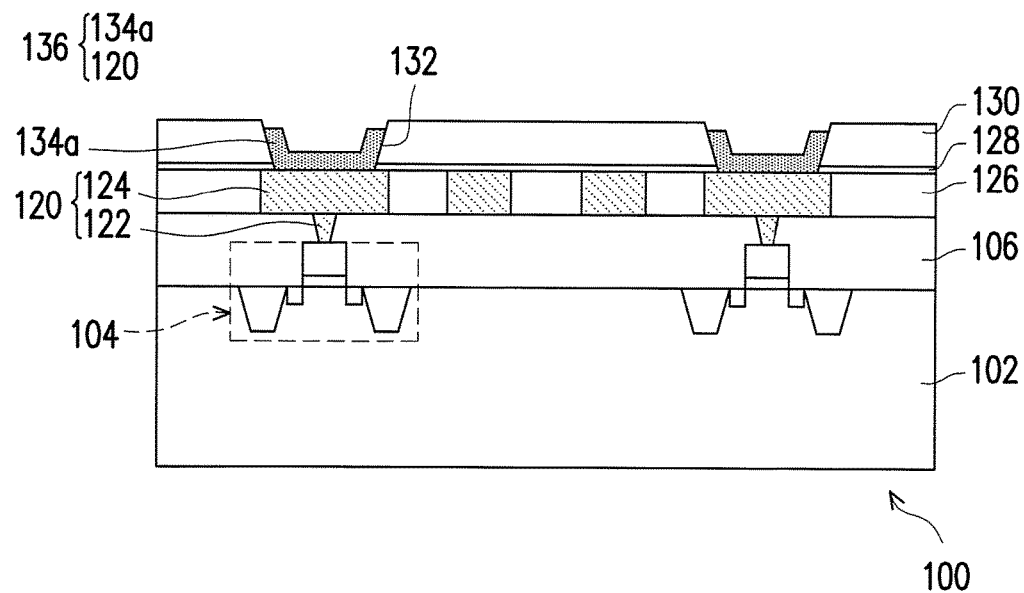

Referring to FIG. 1B and FIG. 1C, with the masks 140 as an etching mask, an etching process (e.g., a dry etching) is performed to the first conductive material layer 134. The first conductive material layer 134 on the first passivation layer 130 is removed. At the same time, portions of the first conductive material layer 134 in the openings 132, which are not covered by the masks 140, are also removed. Thus, first test pads 134a are formed in the openings 132 and a top surface of the first test pads 134a near the sidewalls of the openings 132 is lower than the top surface of the first passivation layer 130. In other words, the first test pads 134a have a U-shape and the top surface of the first test pads 134a and the top surface of the first passivation layer 130 forms a step. In these embodiments, a combination of the first test pads 134a and the first interconnection 120 refer to a first metallization structure 136. Thereafter, the masks 140 are removed by dry etching, wet etching or a combination thereof, for example.

Figure 1D:
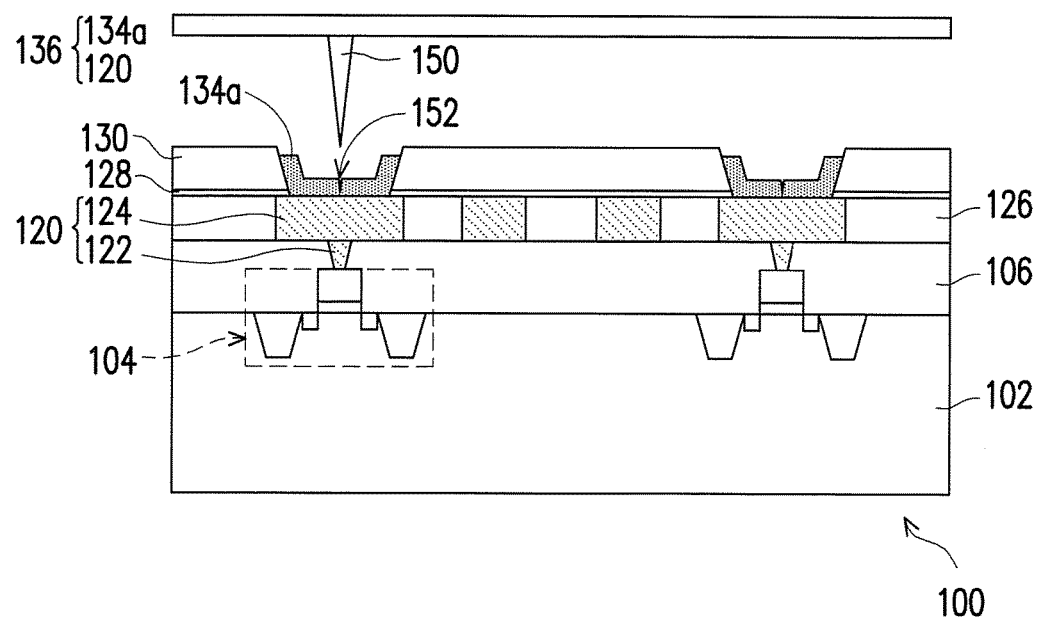

Referring to FIG. 1D and FIG. 6, step S10, a die performance test is conducted to the first metallization structure 136 of the first semiconductor wafer 100 to identify or select known good dies (KGDs). In some embodiments, the die performance test is conducted by using a die performance probe 150. The die performance probe 150 is inserted into the first test pads 134a of the first metallization structure 136, and a probe mark 152 is formed in the upper portion of the first test pads 134a after the die performance test. A depth of the probe mark 152 is in a range from 2000 angstroms to 6000 angstroms, for example.

Figure 1E:
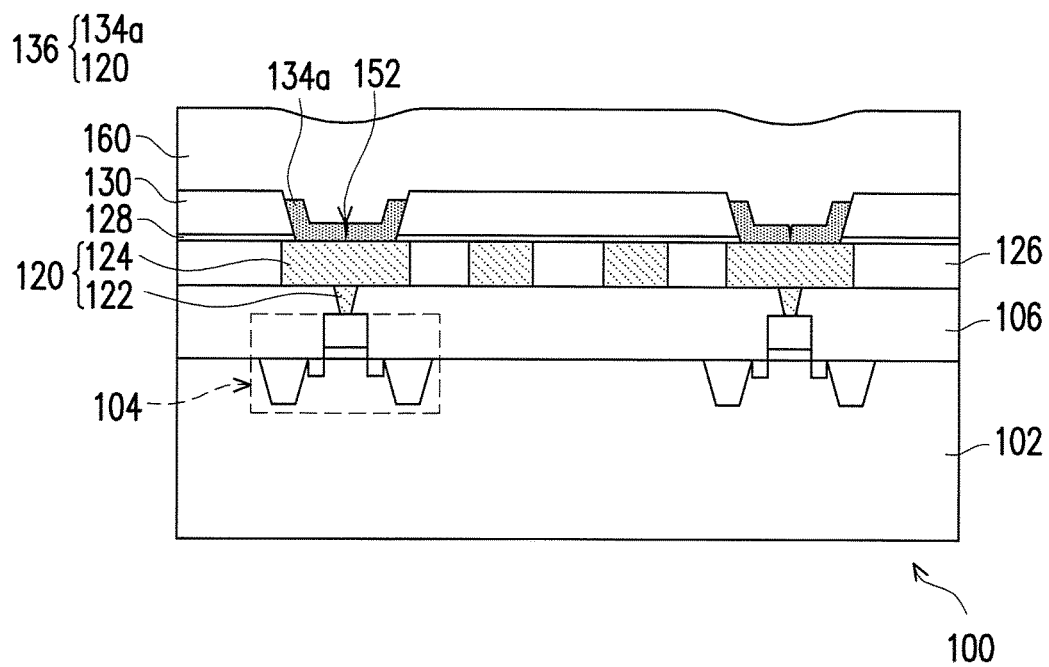
Figure 1F:
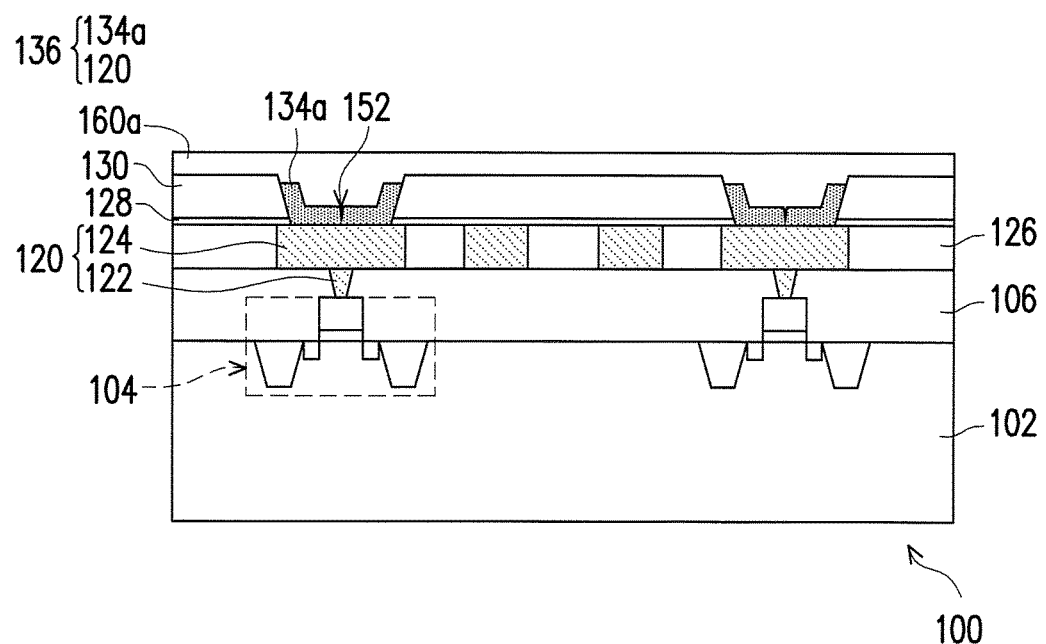

Referring to FIG. 1E and FIG. 1F, and FIG. 6, step S12, a first dielectric material layer 160 is formed over the first passivation layer 130 and the first test pads 134a of the first semiconductor wafer 100. The first dielectric material layer 160 includes silicon oxide, silicon nitride, silicon oxynitirde, or a combination thereof, for example. A method of forming the first dielectric layer 160 includes, for example, CVD, PVCVD, or the like. Thereafter, a planarization process is performed to the first dielectric material layer 160 to form a first dielectric layer 160a. In some embodiments, the planarization process may be a chemical mechanical polishing (CMP) process so that the first dielectric layer 160a has a planar surface.

Figure 1G:
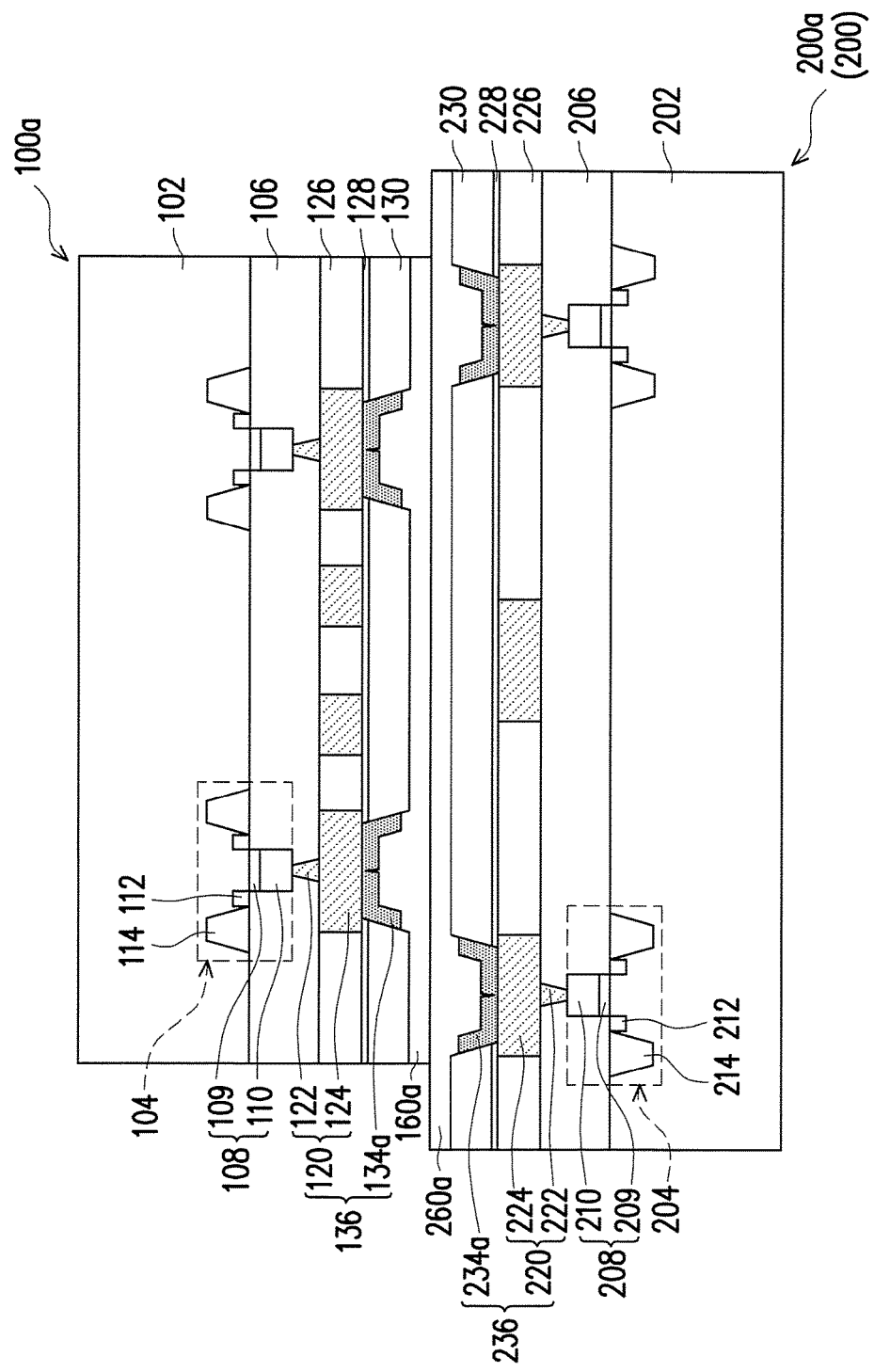

Referring to FIG. 1G, after the die performance test is performed and the first dielectric material layer 160 is formed, a dicing or singulation process is performed to the first semiconductor wafer 100, so as to separate the first die 100a from each other. The cutting process used for separating the first die 100a typically involves dicing the first semiconductor wafer 100 with a rotating blade or a laser beam (not shown) along the scribe-line regions. In other words, the dicing or singulation process is, for example, a laser cutting process or a mechanical cutting process.

Referring to FIG. 1G, a second semiconductor wafer 200 is provided. A structure of the second semiconductor wafer 200 may be similar to or different to a structure of the first semiconductor wafer 100. In some embodiments, the second semiconductor wafer 200, similar to the first semiconductor wafer 100, is provided. The semiconductor wafer 200 includes a second substrate 202 and device regions 204. The material of the second substrate 202 is similar to that of the first substrate 102. Similar to the first device regions 104, the second device regions 204 may include a gate structure 208, source/drain regions 212, and isolation structures 214. Similar to the gate structure 108, the gate structure 208 includes a gate dielectric layer 209, a gate electrode 210, and possibly spacers (not shown). Similar to the first semiconductor wafer 100, the second semiconductor wafer 200 further includes a second metallization structure 236, a cap layer 228, a second passivation layer 230, second test pads 234a, and a second dielectric layer 260a. The second metallization structure 236 includes the second test pads 234a and a second interconnection 220. The second interconnection 220, similar to the first interconnection 120, includes contact plugs 222 embedded in a dielectric layer material 206 and conductive lines 224 embedded in a second insulating material layer 226.

In alternative embodiments, the second semiconductor wafer 200 is different to the first semiconductor wafer 100. For example, the second semiconductor wafer 200 may be manufactured according to any one of methods of manufacturing the semiconductor wafer in the following embodiments.

Referring to FIG. 1G and FIG. 6, step S10 through step 12, the die performance test may also be conducted to the second semiconductor wafer 200 before a second dielectric layer 260a is formed on the second semiconductor wafer 200. In this case, a first die 100a that is a KGD selected from the first semiconductor wafer 100 are bonded to a second die 200a that is a KGD of the second semiconductor wafer 200. Therefore, a yield rate may be improved.

In alternative embodiments, the second semiconductor wafer 200 may also be a carrier, a substrate, a die, or any physical structure suitable to load or bond with the KGDs selected from the first semiconductor wafer 100.

Referring to FIG. 1G and FIG. 6, step S14, in some embodiments, the first die 100a is selected from and picked up from the first semiconductor wafer 100. The first die 100a and the second die 200a of the second semiconductor wafer 200 are face-to-face bonded together by fusion bonding. The first die 100a and the second die 200a are bonded at the top surface of the first dielectric layer 160a and the top surface of the second dielectric layer 260a. In some embodiments, the first die 100a is bonded to the second die 200a of second semiconductor wafer 200 by direct surface bonding process, for example. A direct surface bonding process creates an oxide-to-oxide bond through a cleaning and/or surface activation process followed by applying pressure, heat and/or other bonding process steps to the joined surfaces. In some embodiments, the bonded dies or the bonded die/wafer are baked, annealed, pressed, or otherwise treated to strengthen or finalize the bond.

Figure 1H:
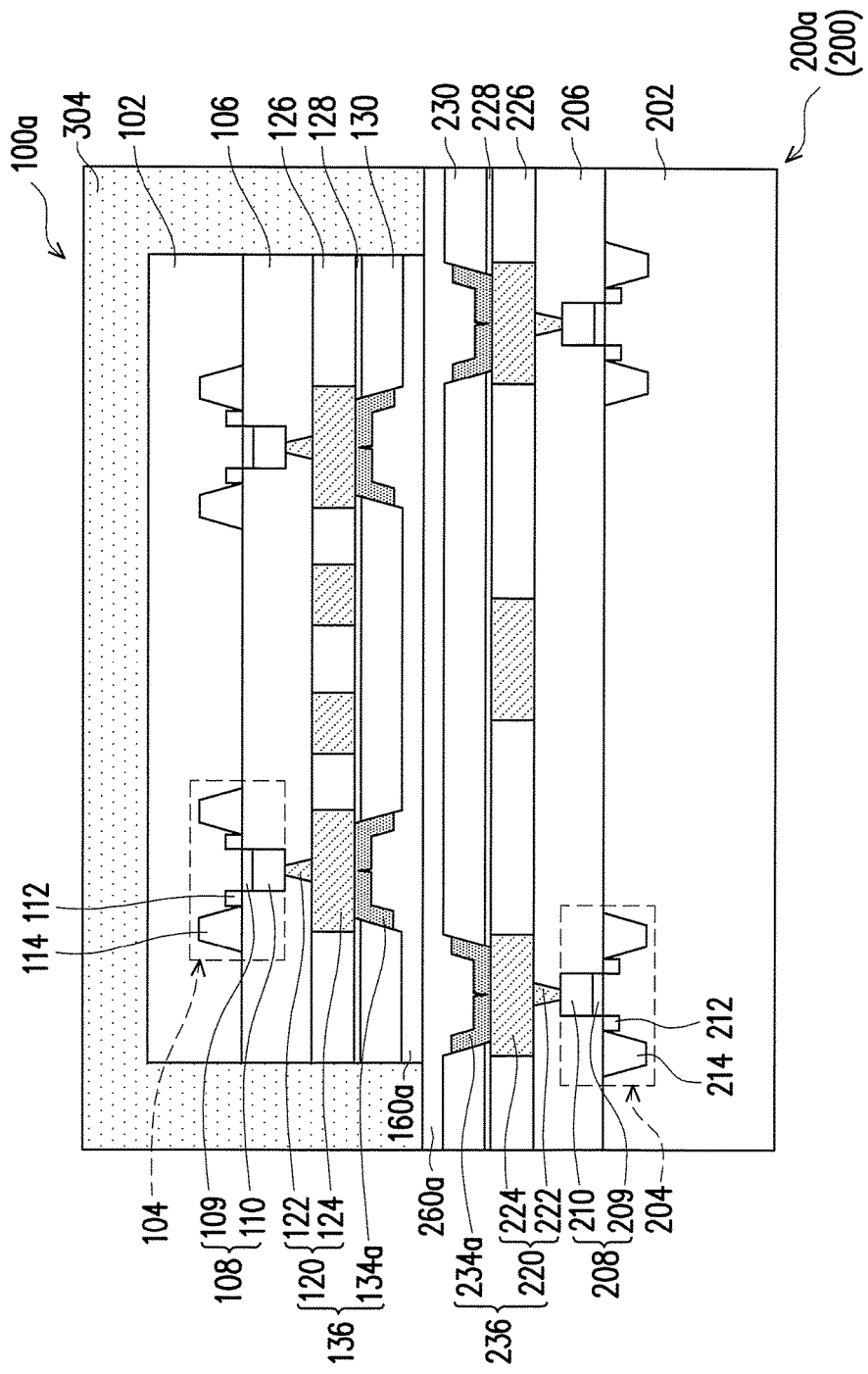

Referring to FIG. 1H, an encapsulant 304 is formed aside the first die 100a. More specifically, the encapsulant 304 is formed around the first die 100a and overlays the top surface of the second semiconductor wafer 200. The encapsulant 304 is a molding compound, a molding underfill, a resin (such as epoxy) and/or the like. In some embodiments, the encapsulant 304 is shaped or molded using for example, a mold (not shown) which may have a border or other feature for retaining encapsulant 304 when applied. Such a mold may be used to pressure mold the encapsulant 304 aside or around the first die 100a to force the encapsulant 304 into openings and recesses, eliminating air pockets or the like in the encapsulant 304. In some embodiments, the encapsulant 304 is a nonconductive or dielectric material, such as an epoxy, a resin, a moldable polymer such as polybenzoxazol (PBO), polyimide, benzocyclobutene (BCB), a combination thereof or the like, or another moldable material. For example, the encapsulant 304 is an epoxy or resin that is cured through a chemical reaction or by drying. In some embodiments, the encapsulant 304 is an ultraviolet (UV) cured polymer. In some embodiments, a dielectric or insulating film comprising an oxide, nitride, or the like is formed over the package. In such embodiments, the encapsulant 304 is replaced by the insulating film. However for the sake of brevity, embodiments of the encapsulant 304 are referred to herein as comprising the dielectric or insulating film. In some embodiments, the insulating film can be an oxide or a nitride film, such as silicon nitride, silicon oxide, silicon oxynitirde, or another dielectric material, and is formed by CVD, PECVD or another process.

The encapsulant 304 may be reduced or planarized by, for example, grinding, a CMP, etching or another process. For example, where the encapsulant 304 is an insulating film such as an oxide or a nitride, a dry etch or CMP is used to reduce or planarize the top surface of the encapsulant 304. In some embodiments, the encapsulant 304 may overlay the first die 100a after planarization as shown in FIG. 1H. In alternative embodiments, the encapsulant 304 is reduced so that the first die 100a is exposed (not shown). In some embodiments, the first substrate 102 of the first die 100a is thinned or reduced in the same process as the encapsulant 304, resulting in a backside surface of the first die 100a that is substantially planar with the surface of the encapsulant 304. In other embodiments, the second substrate 202 of the second die 200a may be thinned or reduced in the same process.

Figure 1I:
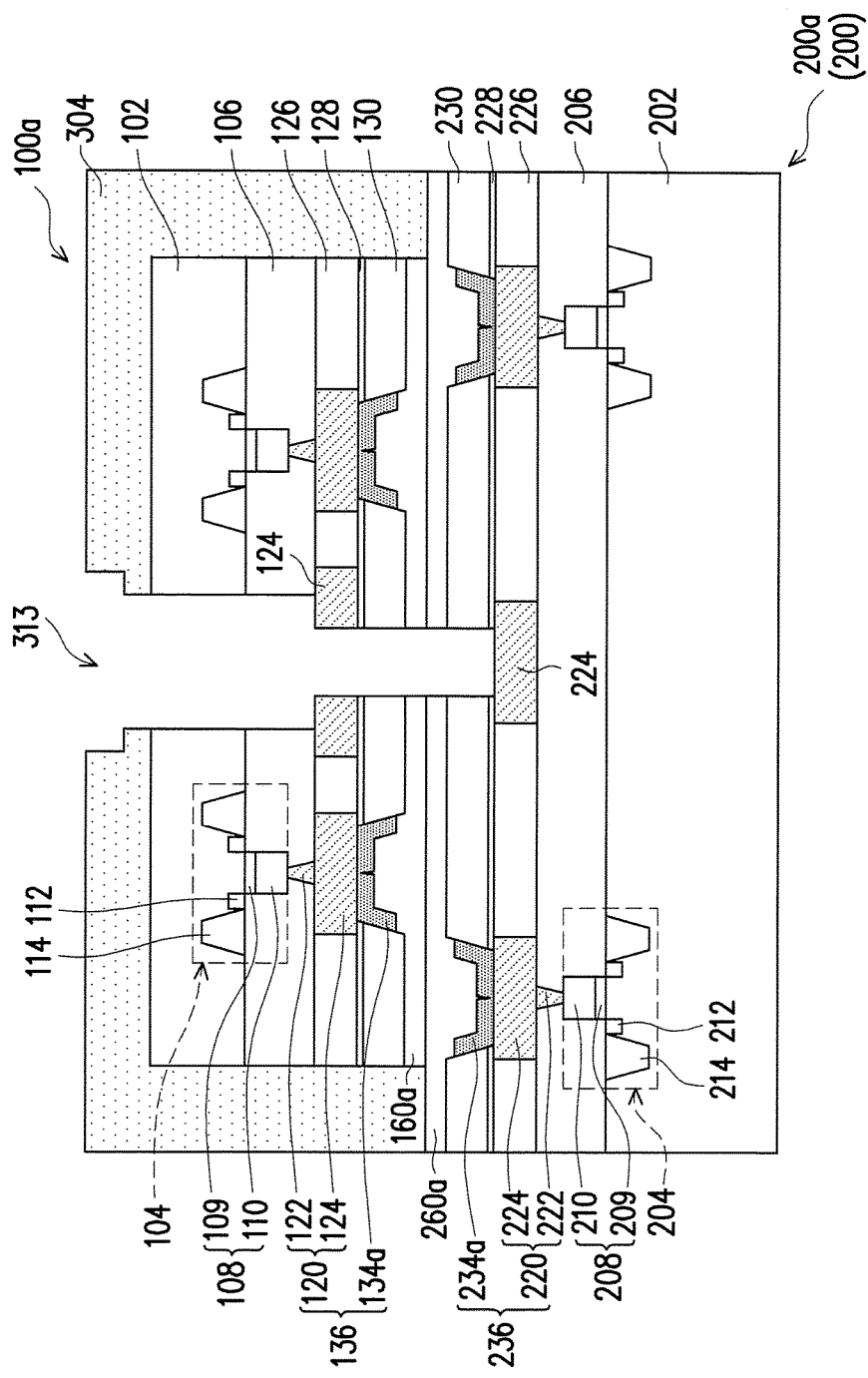
Figure 1J:
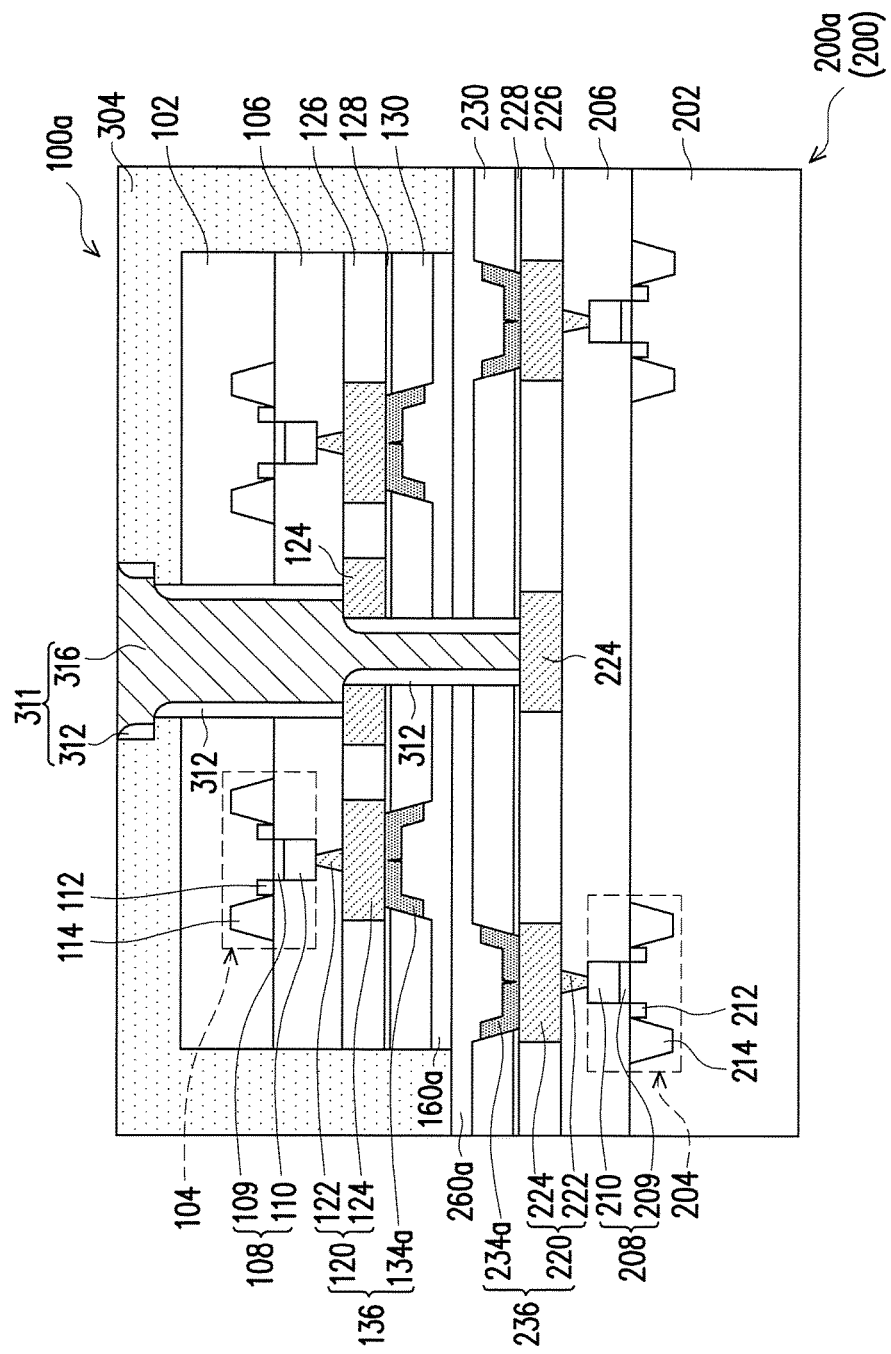

Referring to FIG. 1I to FIG. 1J and FIG. 6, step S16, a through-substrate via (TSV) 311 is formed to penetrate through the first die 100a. The TSV 311 is used to provide electrical connections and for heat dissipation for the stack structure 300a. In some embodiments, the TSV 311 is used to connect the conductive lines 224 on the second semiconductor wafer 200 to back-side of the first die 100a. In alternative embodiments, the TSV 311 may be connected with redistribution lines (RDLs) which may be formed in the following embodiments on the second semiconductor wafer 200 to the first die 100a. In yet alternative embodiments, the first conductive lines 124 and the first conductive lines 224 may be electrical connected by the TSV 311. Although FIG. 1J only shows one TSV 311, more than one TSV may be formed.

Referring to FIG. 1I, the stack structure 300a is patterned and a TSV opening 313 is formed extending through the first die 100a to expose a portion of the conductive lines 224 of the second semiconductor wafer 200 by one or more etching processes. In some embodiments, the TSV opening 313 is formed using a dual damascene via last process. In alternative embodiments, the TSV opening 313 is formed using two or more etch processes and time mode etch processes so that a depth and a width of the TSV opening 313 can be controlled to a predetermined depth and width. In yet alternative embodiments, upper portions of the TSV opening 313 having width wider than lower portions of the TSV opening 313 as shown in FIG. 1I.

In some embodiments, the TSV 311 includes spacers 312 and a conductive via material 316. The spacers 312 are formed on sidewalls of the TSV opening 313 to act as an isolation layer such that the conductive via material 316 and the first substrate 102 do not directly contact each other. In some embodiments, as shown in FIG. 1J, the spacers 312 leave portions of the lateral surface of the conductive line 124 exposed in the TSV opening 313 so that a subsequently formed conductive via material 316 can be electrically contacted with the conductive line 224. In some dual damascene embodiments, separate spacers 312 are formed in the upper and lower portions of the TSV opening 313, with the upper and lower spacers 312 laterally separated from each other and exposing a lateral surface of the conductive line 124.

The formation of spacers 312 includes forming an insulating material layer (not shown), and then performing an anisotropic etching process. The insulating material layer is made of an insulating material including silicon oxide, silicon nitride, silicon oxynitride, for example. The insulating material layer may be formed by using a PECVD process or other applicable processes. The insulating material layer may be a single layer or multi-layers. In some embodiments, the spacers 312 have a thickness in a range from about 100 angstroms to 5000 angstroms. The conductive via material 316 is made of copper, copper alloys, aluminum alloys, or combinations thereof. Alternatively, other applicable materials may be used. In some embodiments, conductive via material 316 is formed by plating.

In some embodiments, a diffusion barrier layer is conformally formed over the spacers 312 (not shown). The diffusion barrier layer is used to prevent conductive via material 316 which is formed later from migrating to the first device regions 104 and the second device regions 204. The diffusion barrier layer is made of tantalum, tantalum nitride, titanium, titanium nitride, cobalt-tungsten (CoW) or a combination thereof, for example. In some embodiments, the diffusion barrier layer is formed by a PVD process.

Figure 1K:
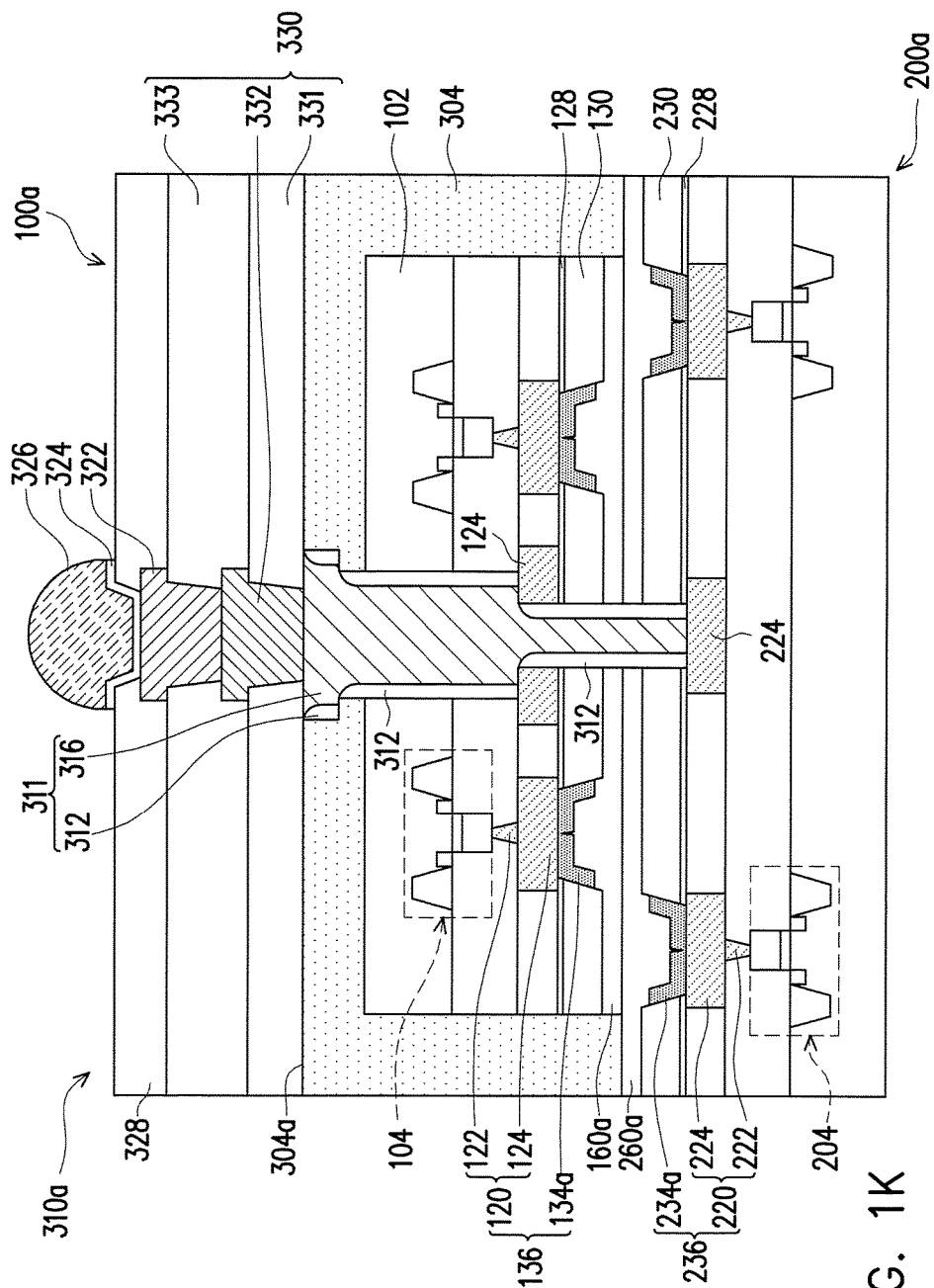

Referring to FIG. 1K, redistribution lines (RDLs) layer 330 with one or more insulating layers (e.g., two insulating layers 331 and 333 are shown in FIG. 1K) and conductive elements 332 may be formed on a top surface 304a of the encapsulant 304. In some embodiments, a diffusion barrier layer (not shown) is formed between the conductive elements 332 and the insulating layer 331. A conductive pad 322 is formed on the RDLs layer 330 and a passivation layer 328 is formed over a portion of the conductive pad 322 and the RDLs layer 330. The conductive pad 322 is electrically connected to the TSV 311 through the RDLs layer 330. In some embodiments, the conductive pad 322 is made of conductive materials with low resistivity, such as copper, aluminum, copper alloys, aluminum alloys, or other applicable materials, for example.

Referring to FIG. 1K, a UBM layer 324 is formed on the conductive pad 322. The UBM 324 layer may contain an adhesion layer and/or a wetting layer. In some embodiments, the UBM layer 324 is made of tantalum, tantalum nitride, titanium, titanium nitride, or the like, for example. In some embodiments, the UBM layer 324 further includes a copper seed layer (not shown).

Referring to FIG. 1K and FIG. 6, step S16, a connector 326 (such as solder ball, conductive pillar, etc.) is formed over the UBM layer 324. In some embodiments, the connector 326 may be made of conductive materials with low resistivity, such as solder or solder alloy. For example, the solder alloy includes stannum (Sn), plumbum (Pb), silver (Ag), copper (Cu), nickel (Ni), bismuth (Bi) or combinations thereof. In some embodiments, the conductive lines 124 of the first die 100a electrically connect to the conductive lines 224 of the second die 200a through the TSV 311 and further electrically connect to the connector 326 through the conductive elements 332.

Referring to FIG. 1K and FIG. 6, step S18, a dicing or singulation process is performed to the stack structure 300a, so as to separate 3DIC structures 310a from each other. The dicing or singulation process is, for example, a laser cutting process or a mechanical cutting process.

Referring to FIG. 1K, in this case, the first die 100a (which is a KGD selected from the first semiconductor wafer 100) is bonded to the second die 200a (which is a KGD selected from the second semiconductor wafer 200) with the first dielectric layer 160a of the first die 100a and the second dielectric layer 260a of the second die 200a. A yield rate of the individual 3DIC is improved since the die performance and selection are completed before dicing. Furthermore, in the first embodiments, the flat topography of the bonding layer may improve the bonding strength. Also, compared to the traditional manufacturing process, photomasks for the test pads or additional passivation layers are omitted to reduce the manufacturing process and process costs.

FIG. 2A to FIG. 2G are schematic cross-sectional views illustrating a manufacturing method of a 3DIC structure in accordance with the second embodiments.

Figure 2A:
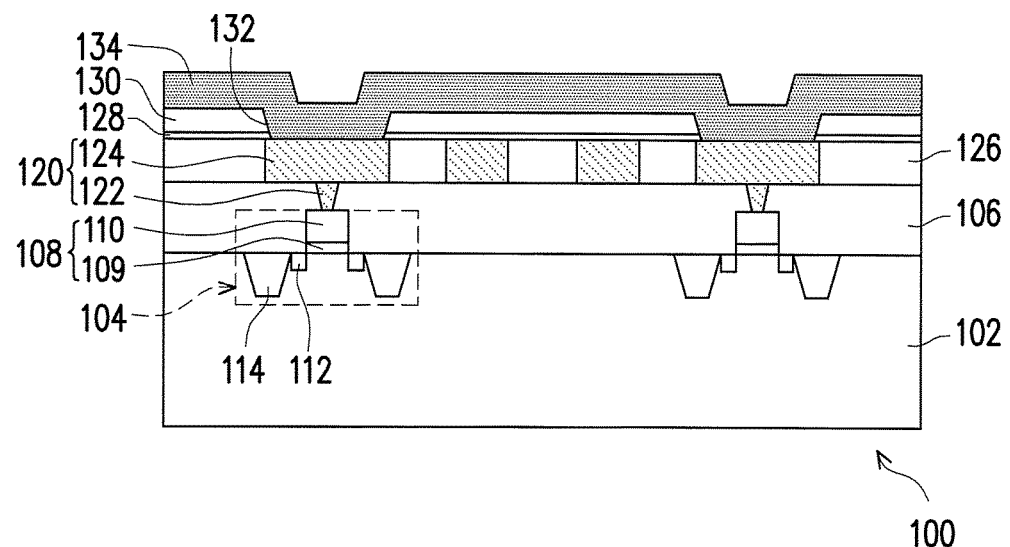
FIG. 2A to FIG. 2G are schematic cross-sectional views illustrating a manufacturing method of a 3DIC structure in accordance with second embodiments.

Referring to FIG. 2A, the second embodiments are similar to the above first embodiments. However, a thickness of the first passivation layer 130 on a first semiconductor wafer 100 in FIG. 2A may be formed thinner than that in FIG. 1A. In some embodiments, the thickness of the first passivation layer 130 is lower than 6000 angstroms, for example.

Referring to FIG. 2A, a first conductive material layer 134 is formed overlying the first passivation layer 130 and the conductive lines 124. The openings 132 in the first passivation layer 130 are full filled with the first conductive material layer 134. In some embodiments, a thickness of the first conductive material layer 134 may be slightly thicker than the thickness of the first passivation layer 130. A material and a method of forming the first conductive material layer 134 are already described above. Therefore, duplicate descriptions will be omitted here.

Figure 2B:
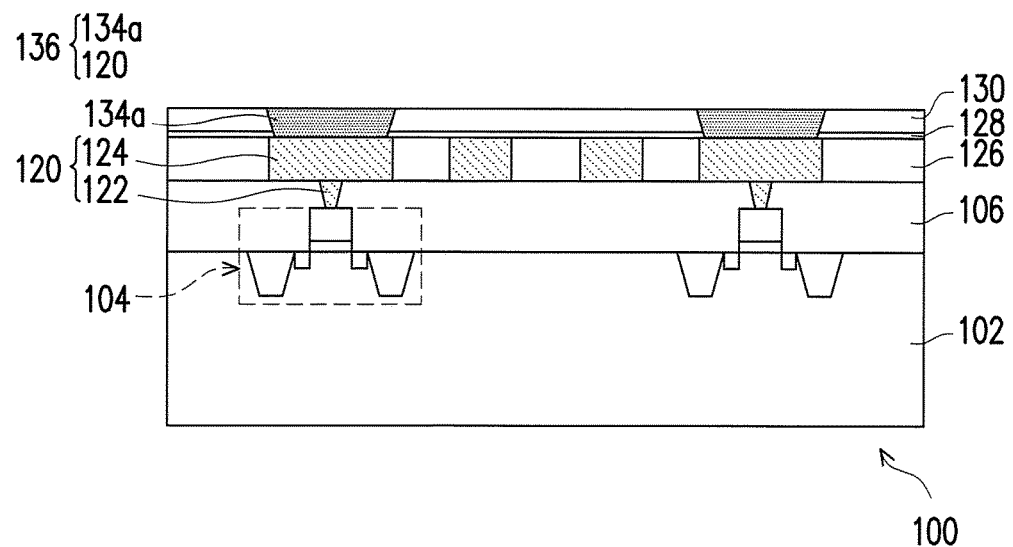
Figure 2C:
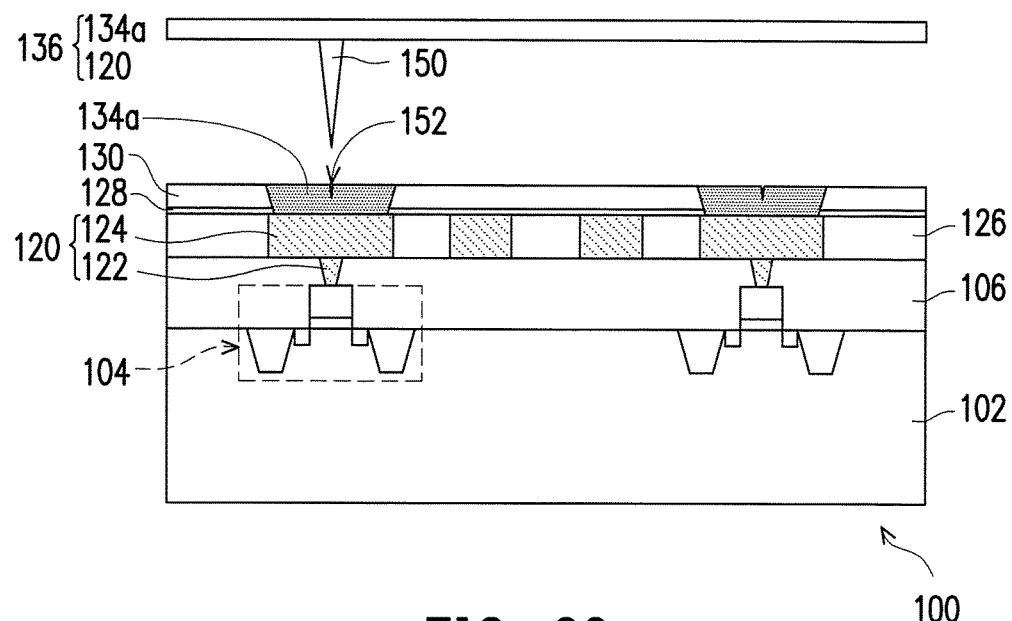
Figure 2D:
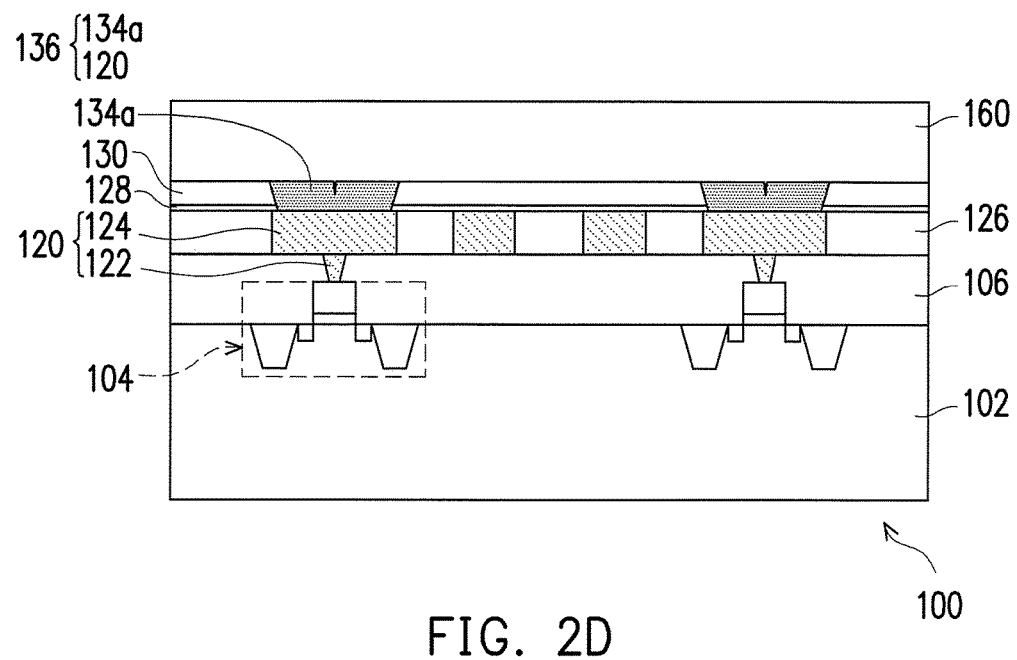
Figure 2E:
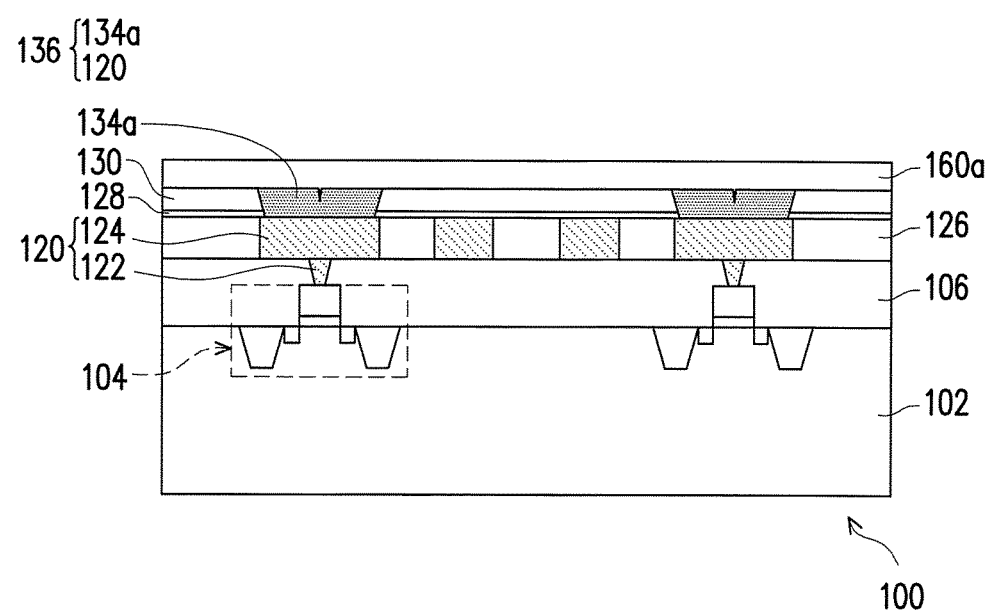
Figure 2F:
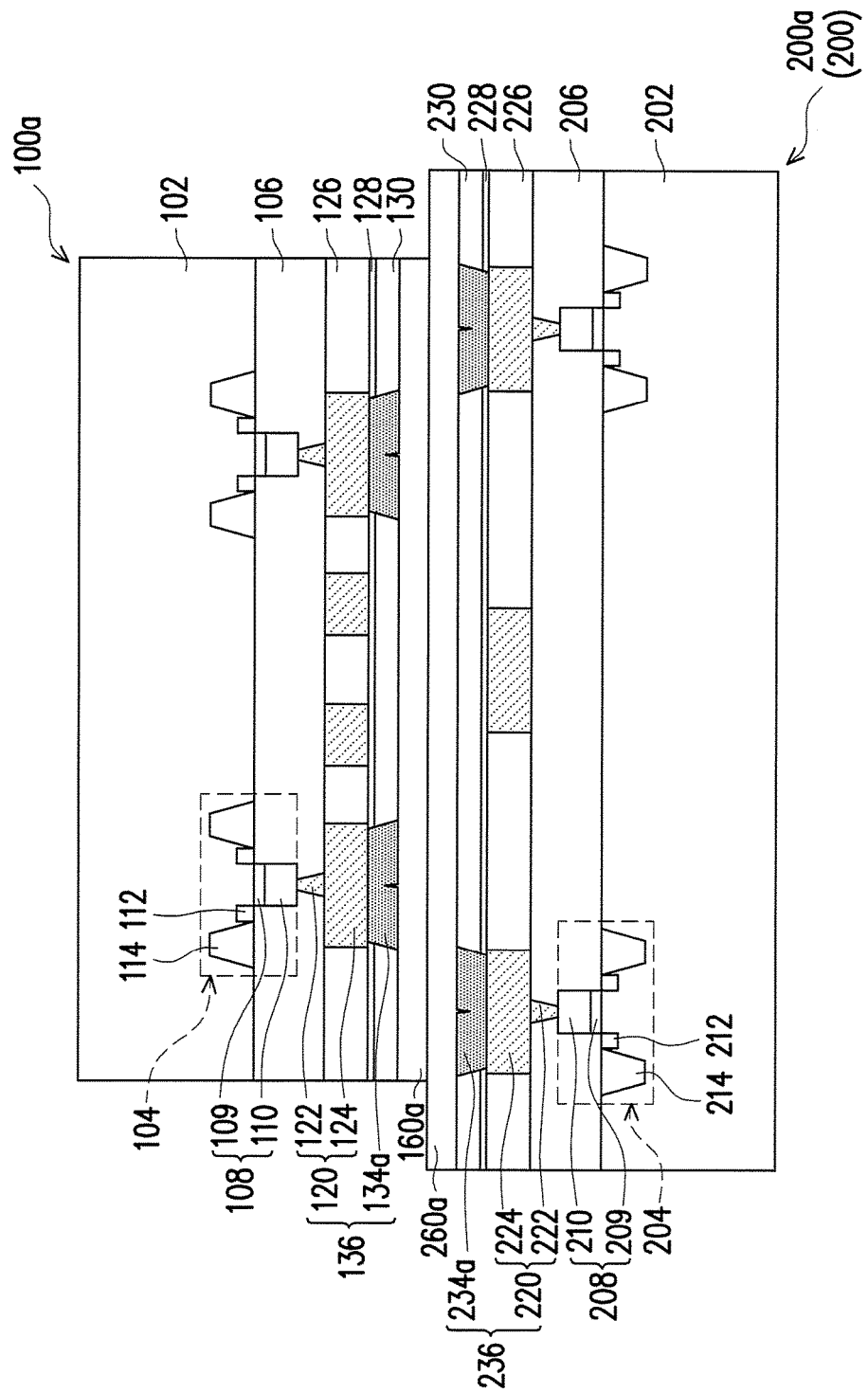
Figure 2G:
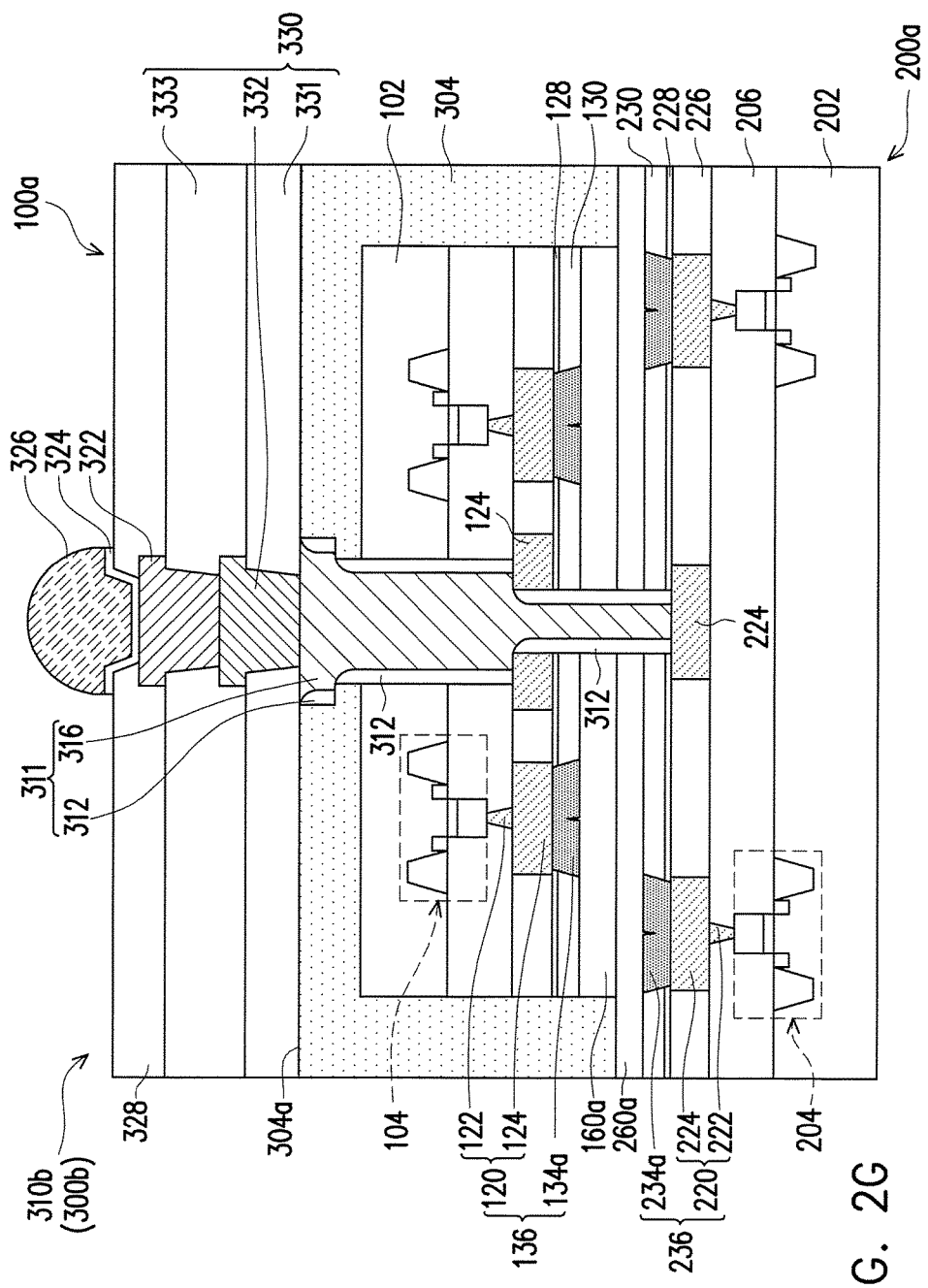

Referring to FIG. 2A and FIG. 2B, a planarization process is performed to the first conductive material layer 134. Portions of the first conductive material layer 134 are remained in the openings 132, and thus, first test pads 134a are formed and embedded in the first passivation layer 130. In some embodiments, a top surface of the first test pads 134a is substantially coplanar with the top surface of the first passivation layer 130. The planarization process is a CMP process, or the like, for example. In some embodiments, a first metallization structure 136 includes the first test pads 134a and an interconnection 120.

Referring to FIG. 2C to FIG. 2G and FIG. 6, step S10 through step S16 are performed according to the methods described in the first embodiments so as to form a stack structure 300b. Thereafter, referring to FIG. 6, step S18, the stack structure 300b may be diced to form 3DIC structures 310b afterwards. The thickness of the first passivation layer 130 is made thinner than that in FIG. 1H therefore a thickness of the stack structure 300b is decreased.

FIG. 3A to FIG. 3G are schematic cross-sectional views illustrating a manufacturing method of a 3DIC structure in accordance with the third embodiments.

Figure 3A:
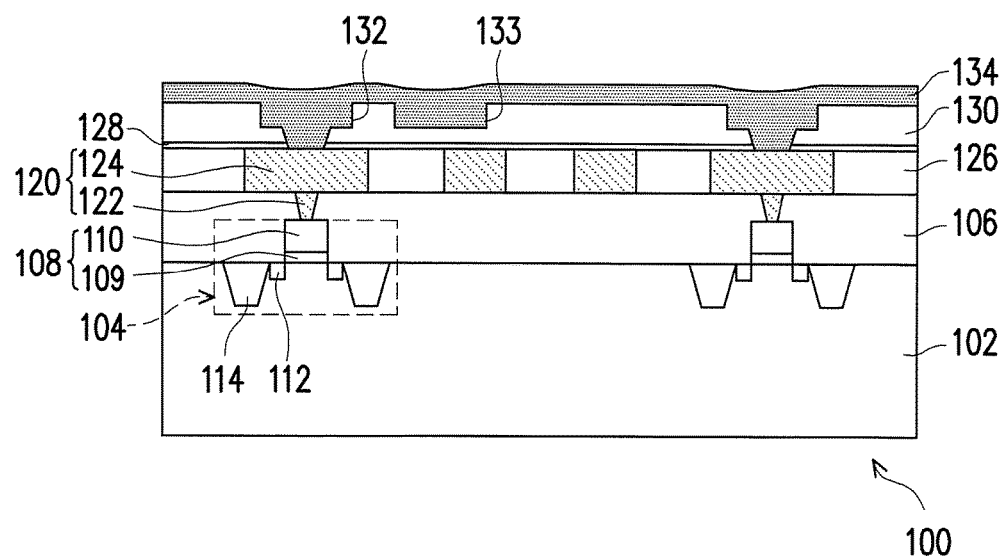
FIG. 3A to FIG. 3G are schematic cross-sectional views illustrating a manufacturing method of a 3DIC structure in accordance with third embodiments.

Referring to FIG. 3A, the third embodiments are similar to the above second embodiments. However, a plurality of openings 132 are formed in the first passivation layer 130 to expose portions of the top conductive lines 124 of an interconnection 120 on a first semiconductor wafer 100. Alternatively or additionally, another opening 133 may also be formed in the first passivation layer 114. In some embodiments, the openings 132 and the opening 133 may be formed at the same time. The openings 132 and the opening 133 respectively includes a trench and a via, for example.

Referring to FIG. 3A, a first conductive material layer 134 is formed overlying the first passivation layer 130 and the conductive lines 124. In some embodiments, the openings 132 and the opening 133 are full filled with the first conductive material layer 134.

Figure 3B:
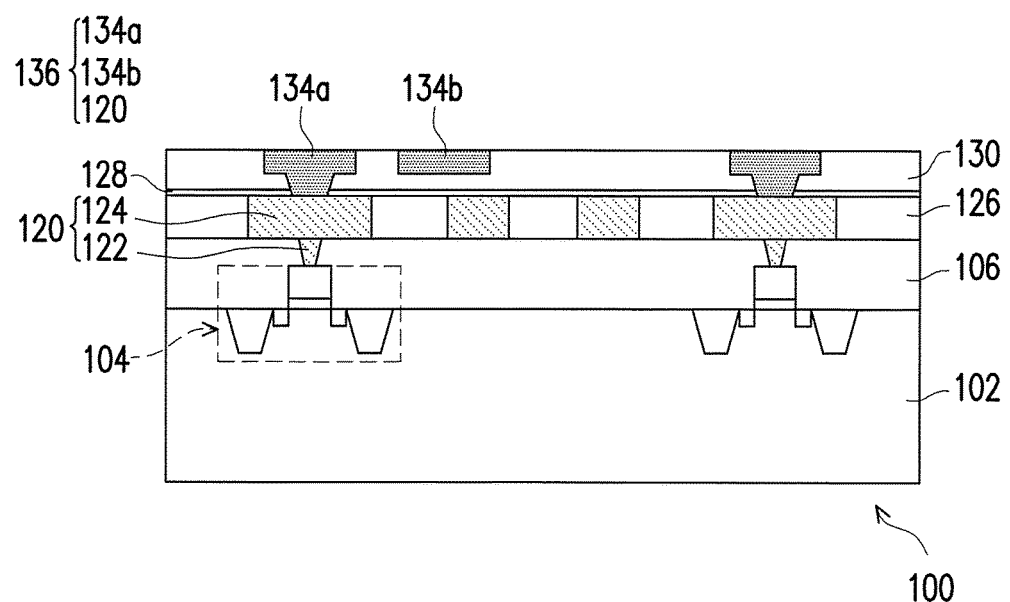
Figure 3C:
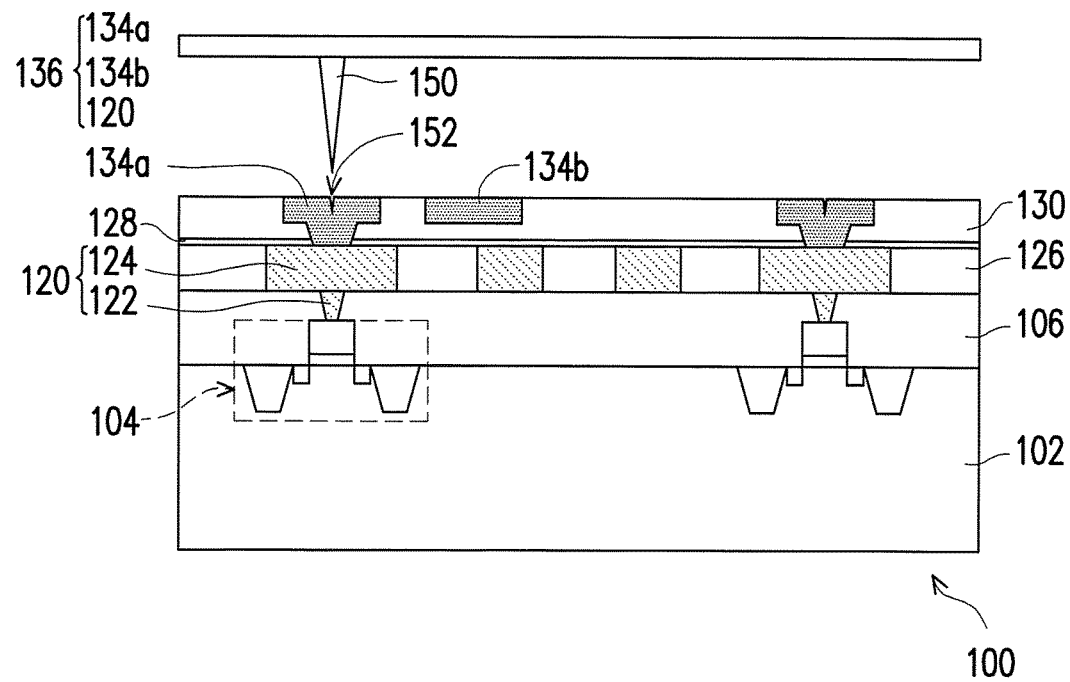
Figure 3D:
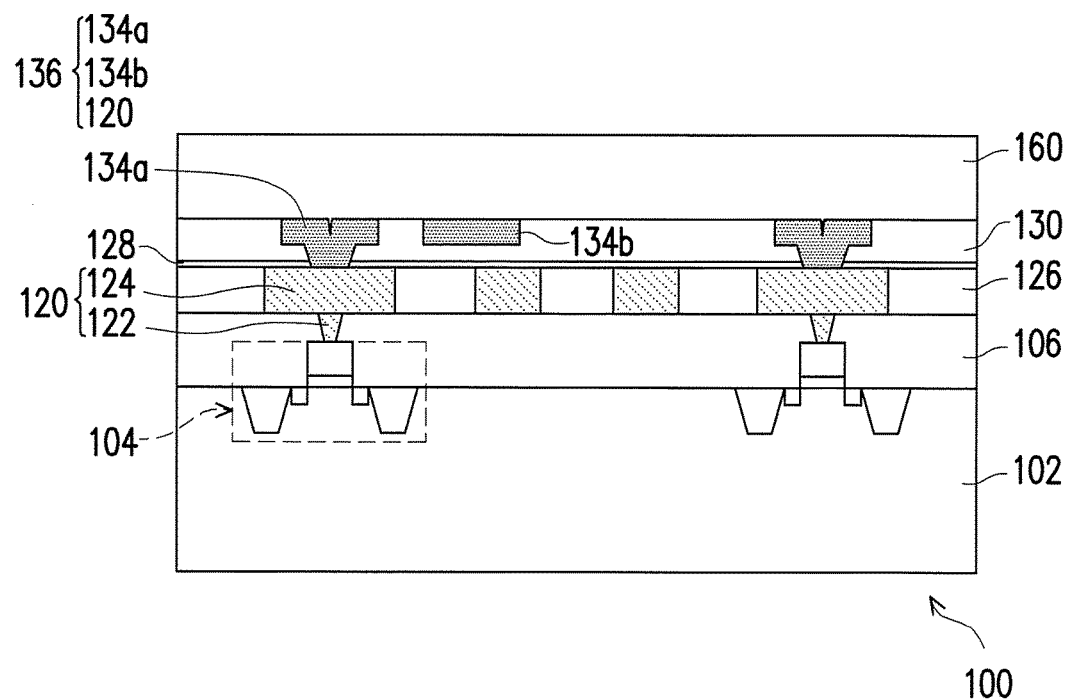
Figure 3E:
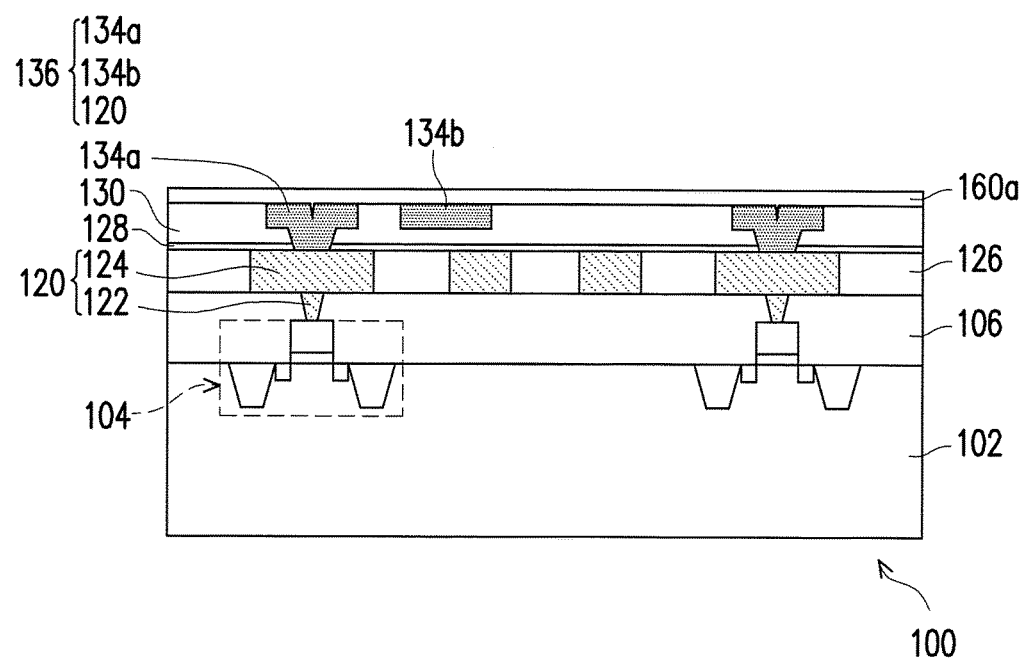
Figure 3F:
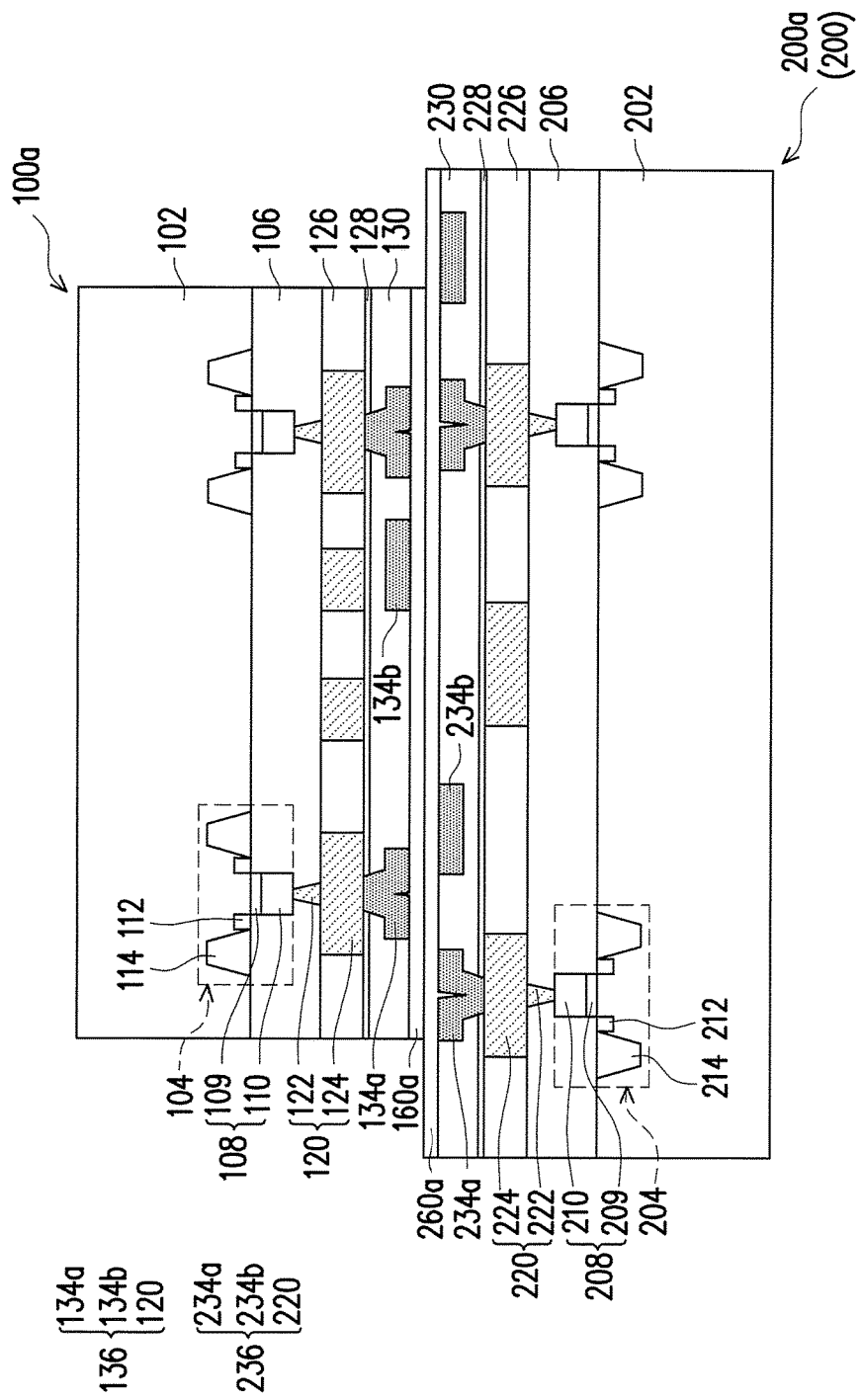
Figure 3G:
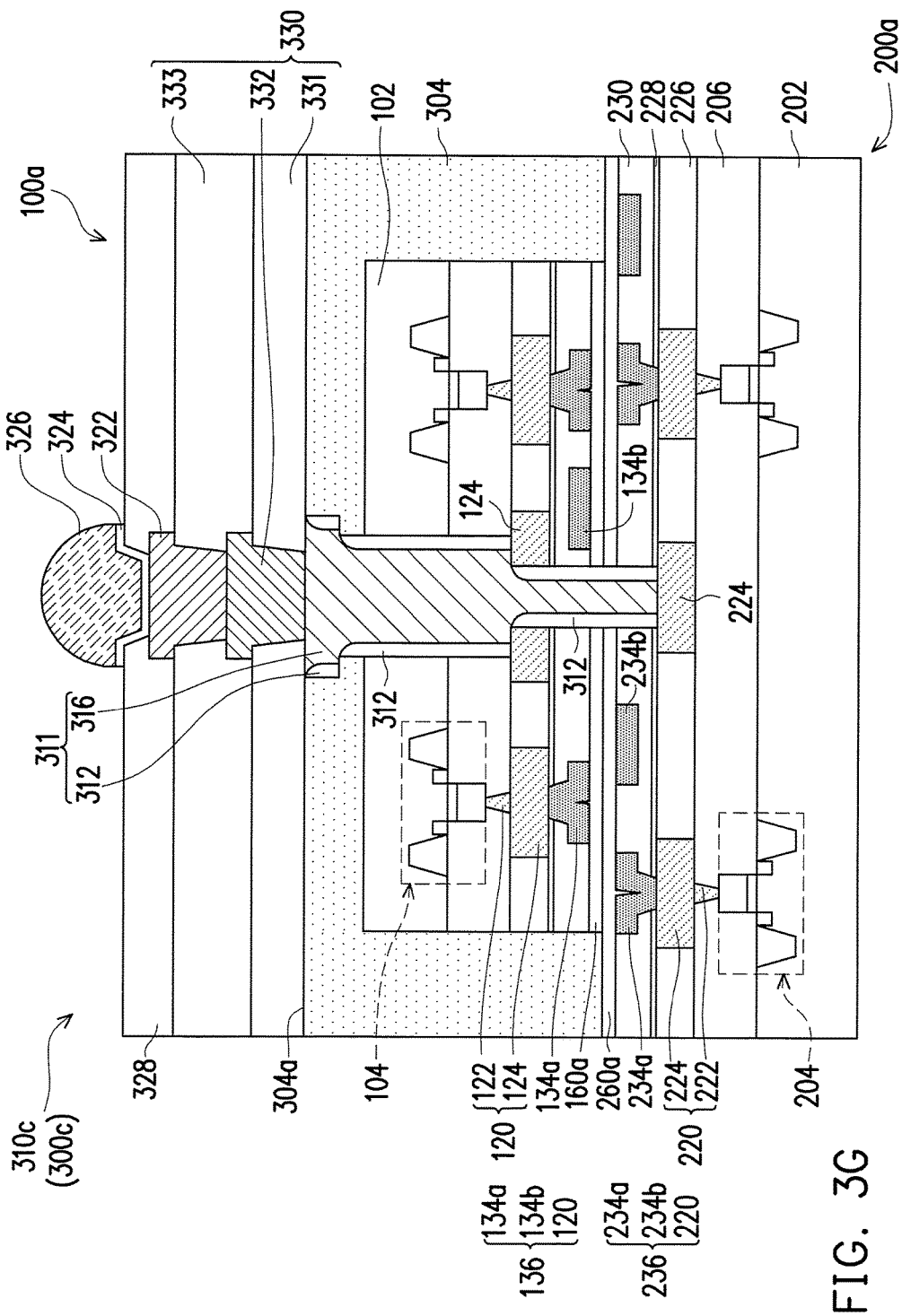

Referring to FIG. 3B, a planarization process is performed to the first conductive material layer 134. The first conductive material layer 134 remained in the openings 132 and the opening 133 are formed as first test pads 134a and the RDL 134b formed embedded in the first passivation layer 130. In some embodiments, a top surface of the first test pads 134a and a top surface of the RDL are substantially coplanar with the top surface of the first passivation layer 130 after the planarization. The planarization process may be a CMP process, or the like, for example. In some embodiments, the first test pads 134a have a T-shape. In some embodiments, a first metallization structure 136 includes the first test pads 134a, the RDL 134b and the interconnection 120.

Referring to FIG. 3C to FIG. 3G and FIG. 6, step S10 through step S16 are performed according to the methods described in the first embodiments so as to form a stack structure 300c. Thereafter, referring to FIG. 3G and FIG. 6, step S18, the stack structure 300c is diced to form 3DIC structure 310c afterwards.

FIG. 4A to FIG. 4F are schematic cross-sectional views illustrating a manufacturing method of a 3DIC structure in accordance with the fourth embodiments.

Figure 4A:
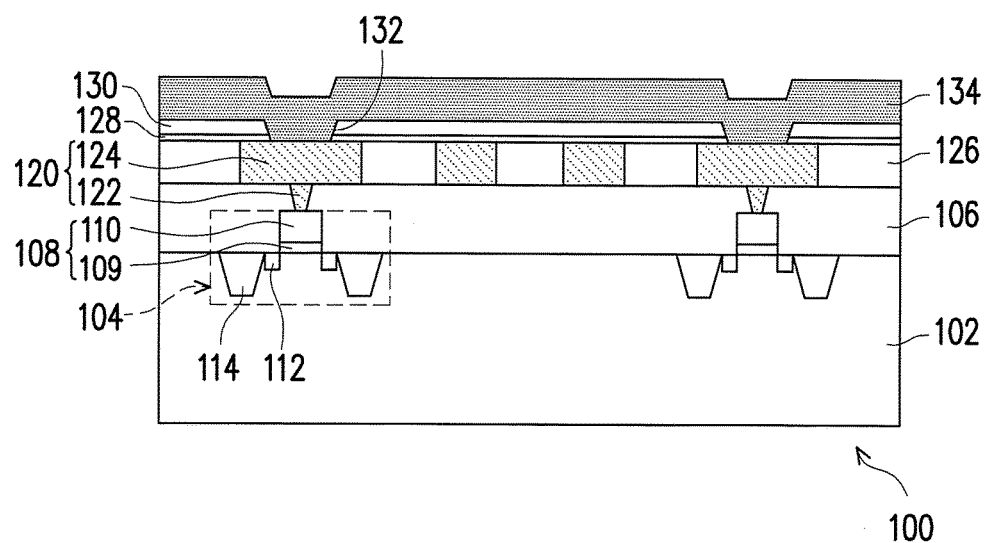
FIG. 4A to FIG. 4F are schematic cross-sectional views illustrating a manufacturing method of a three dimensional integrated circuit structure in accordance with fourth embodiments.
Figure 4B:
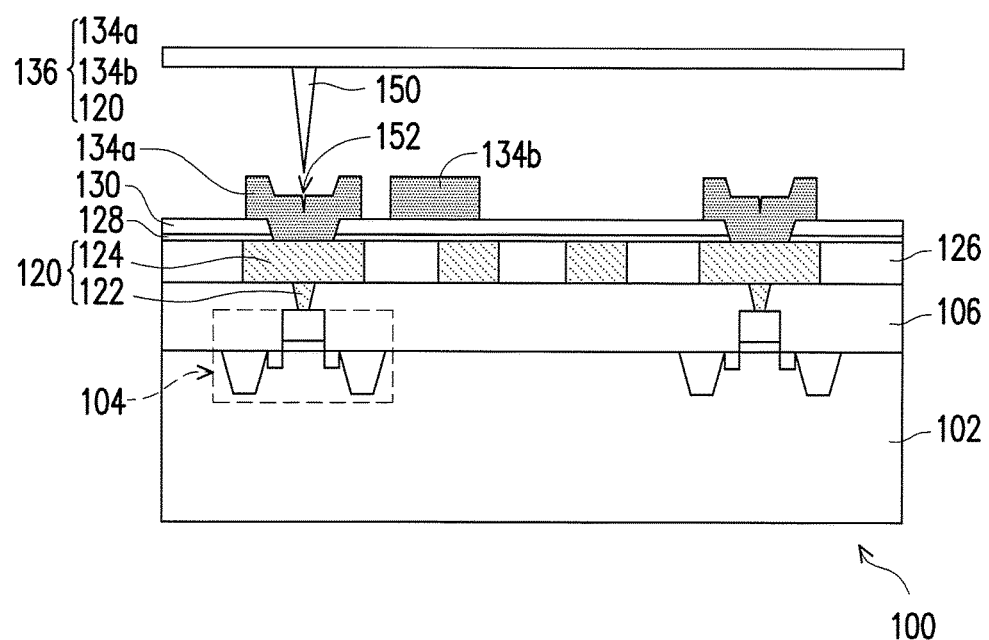

Referring to FIGS. 4A and 4B, the fourth embodiments are similar to the above first embodiments. However, the first conductive material layer 134 is patterned by, for example, a photolithography process and an etching process to form first test pads 134a and a RDL 134b over the first passivation layer 130 and the conductive lines 124 of an interconnection 120. The etching process is a dry etching process, for example. In some embodiments, the dry etching process is a reactive ion etching process, or the like. In some embodiments, a first metallization structure 136 includes the first test pads 134a, the RDL 134b and the interconnection 120.

Figure 4C:
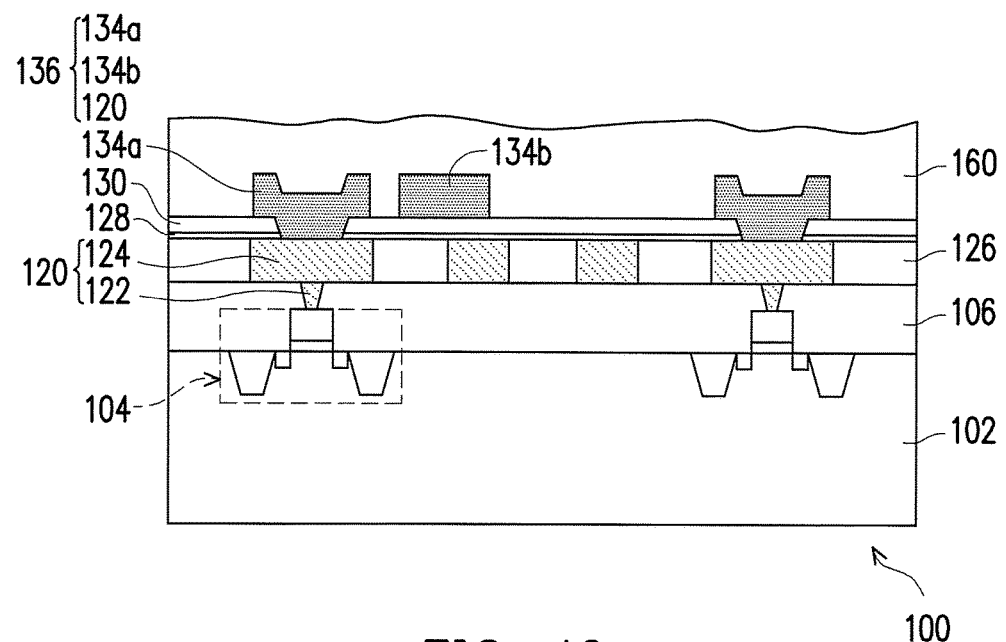
Figure 4D:
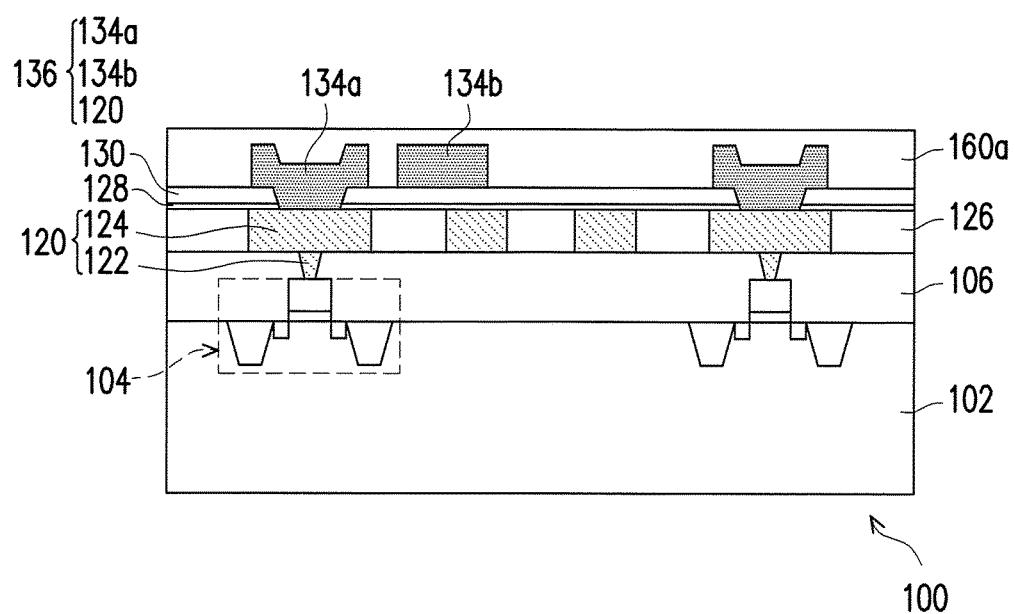

Referring to FIG. 4B to 4D, step S10 through step S12 are performed according to the methods described in the first embodiments. After a die performance test is performed, a first dielectric layer 160a is formed on the first test pads 134a, the RDL 134b and the first passivation layer 130. In other words, the first test pads 134a is formed in the first passivation layer 130 and extending to the first dielectric layer 160a. The RDL 134b is embedded in the first dielectric layer 160a.

Figure 4E:
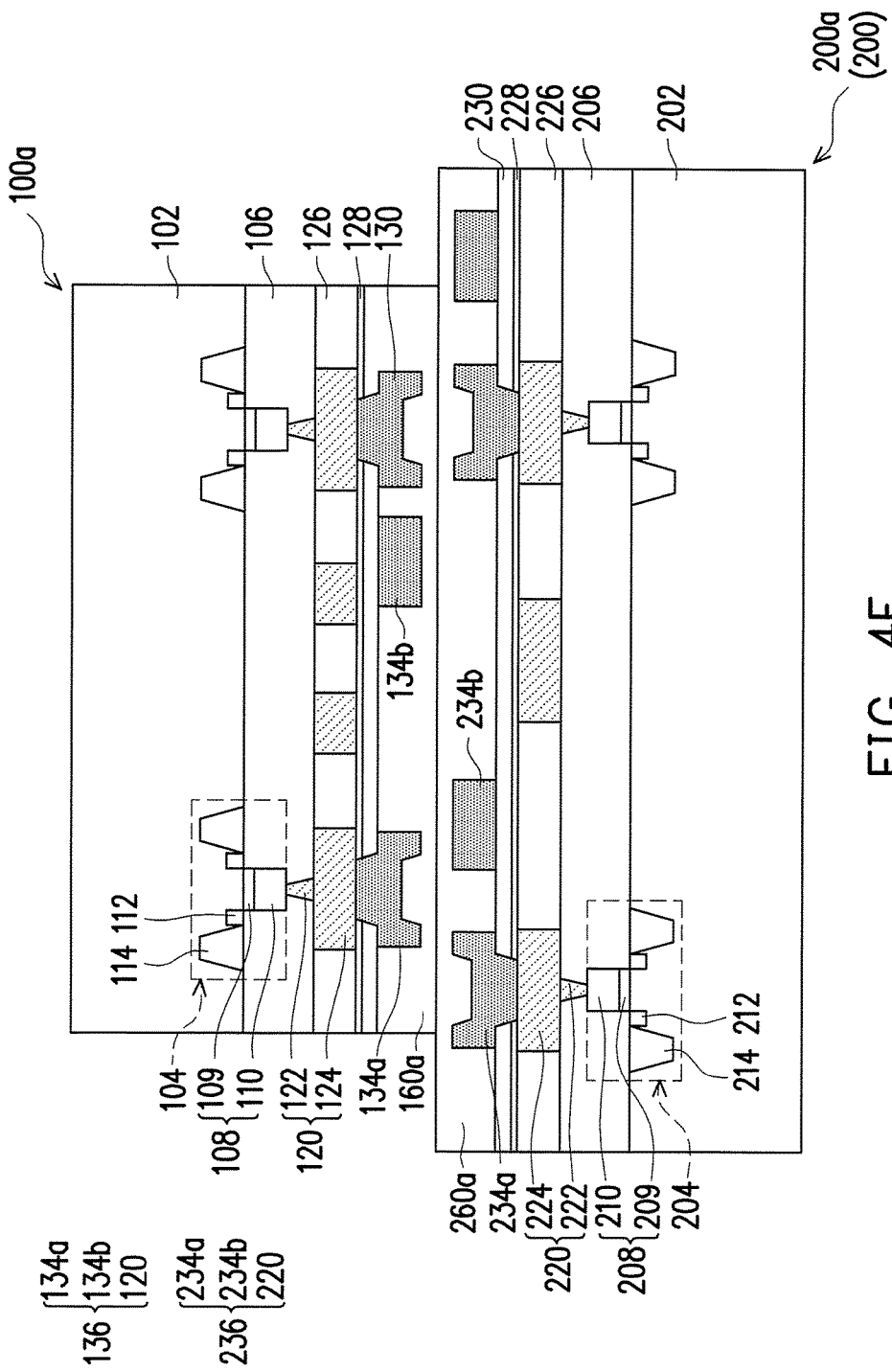
Figure 4F:
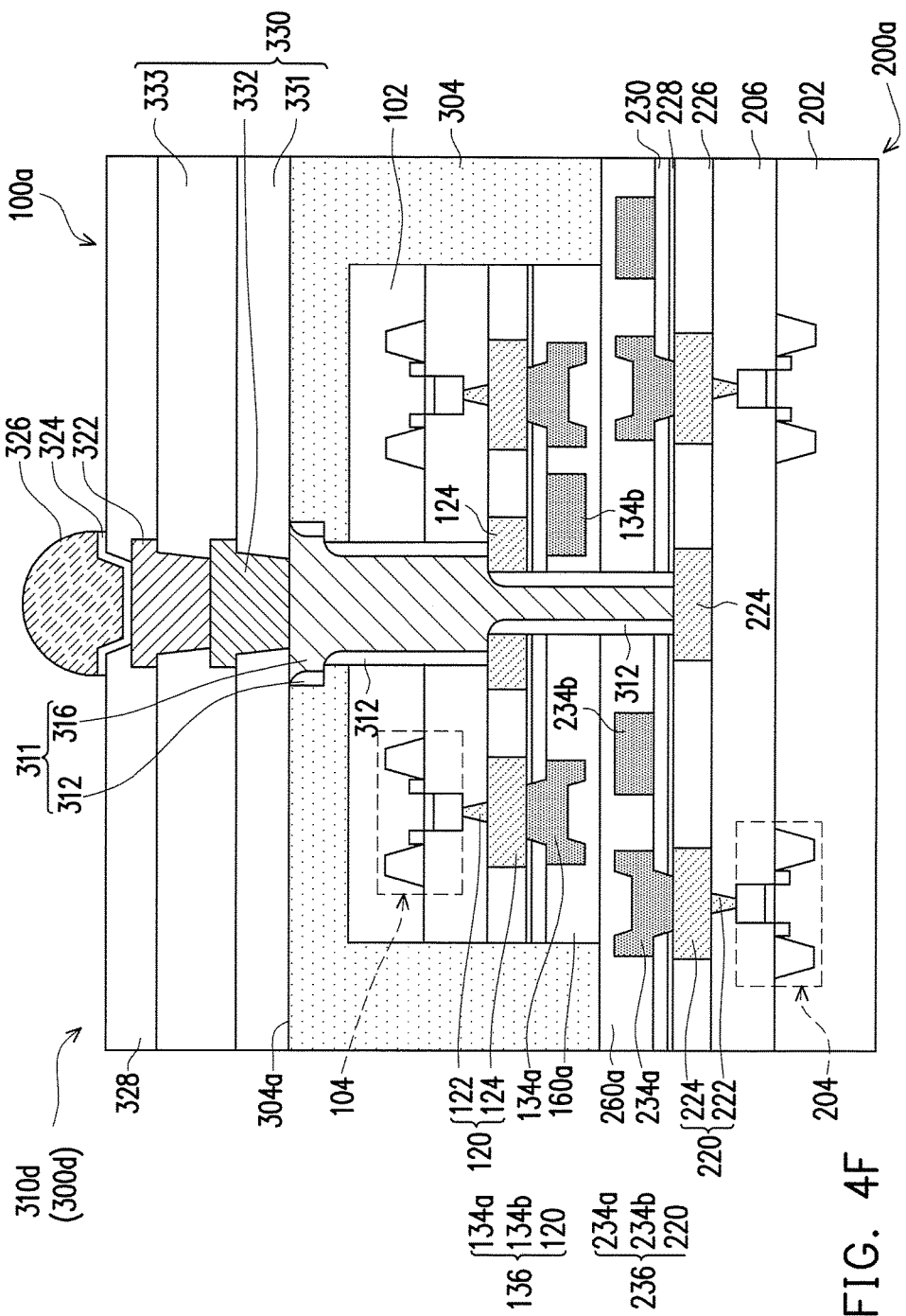

Referring to FIG. 4E and FIG. 6, step S14 through step S16 are performed according to methods described in the first embodiments to form a stack structure 300d. Thereafter, referring to FIG. 6, step S18, the stack structure 300d is diced to form 3DIC structures 310d afterwards.

In the third and fourth embodiments, since the test pads and the RDL may be formed in the same time, the process of manufacturing method may be reduced and the space utilization is improved.

FIG. 5A to FIG. 5G are schematic cross-sectional views illustrating a manufacturing method of a 3DIC structure in accordance with the fifth embodiments.

Figure 5A:
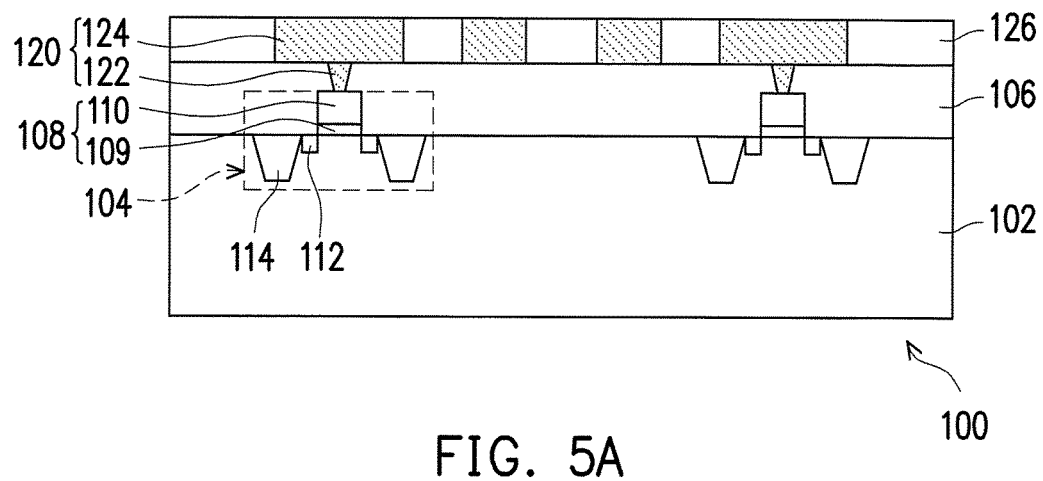
FIG. 5A to FIG. 5G are schematic cross-sectional views illustrating a manufacturing method of a 3DIC structure in accordance with fifth embodiments.

Referring to FIG. 5A, the fifth embodiments are similar to the above first embodiments. However, the cap layer 128, the first passivation layer 130, and the first conductive material layer 134 of the first embodiments are not formed. In these embodiments, a first metallization structure 136 of the first semiconductor wafer 100 includes an interconnection 120.

Figure 5B:
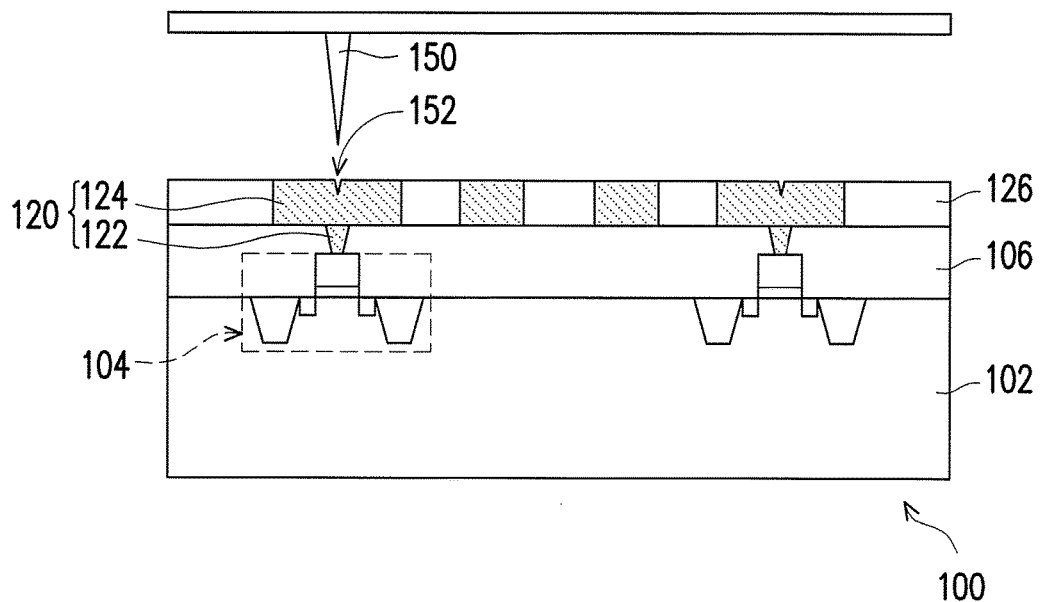

Referring to FIG. 5B and FIG. 6, step S10, a die performance test is conducted to the first semiconductor wafer 100 to identify or select KGDs. In this case, the conductive lines 124 used as the first test pads described above. In some embodiments, the die performance probe 150 is inserted into the conductive lines 124 directly to test. A probe mark 152 is formed on the upper portion of the conductive lines 124 after the die performance test. A depth of the probe mark 152 is in a range from 2000 angstroms to 6000 angstroms, for example.

Figure 5C:
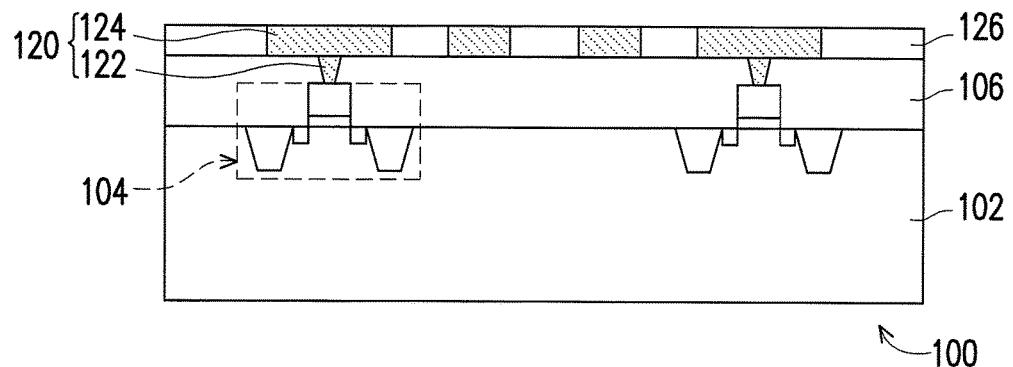

Referring to FIG. 5C, in some embodiments, a planarization process is performed to the first insulating layer 126 and the conductive lines 124 thereby the probe mark 152 may be removed or reduced. The planarization process may be a CMP process, or the like, for example. A surface of the first insulating layer 126 and the conductive lines 124 are substantially planar after the planarization process.

Figure 5D:
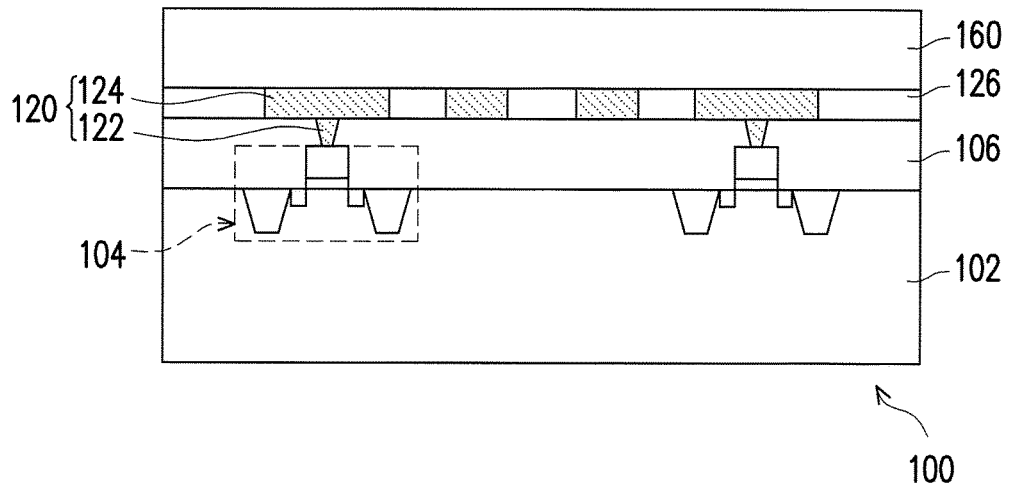
Figure 5E:
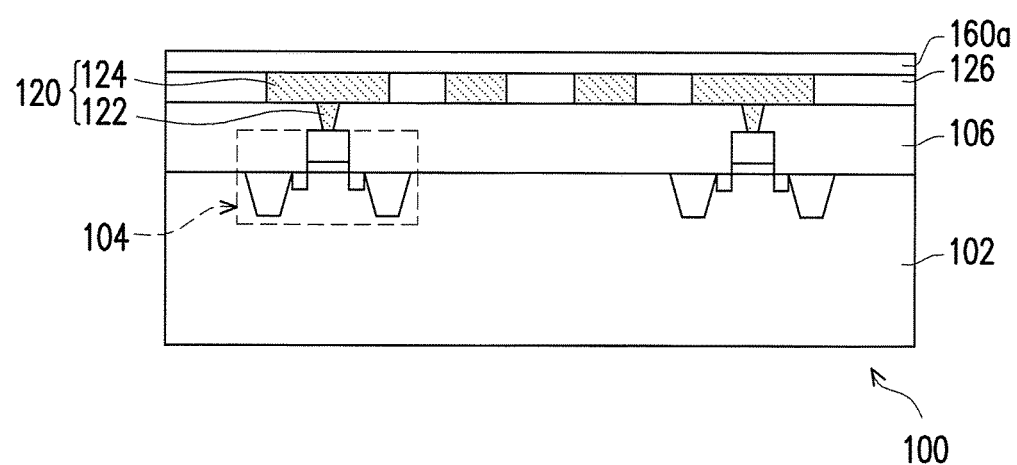

Referring to FIG. 5D and FIG. 5E and FIG. 6, step S12, a first dielectric material layer 160 is formed over the first insulating layer 126 and the conductive lines 124. Another planarizaiton process is performed to the first dielectric material layer 160 to form a first dielectric layer 160a. A thickness, a material, and a method of forming the first dielectric layer 160a are already described above. Therefore, duplicate descriptions will be omitted here.

Figure 5F:
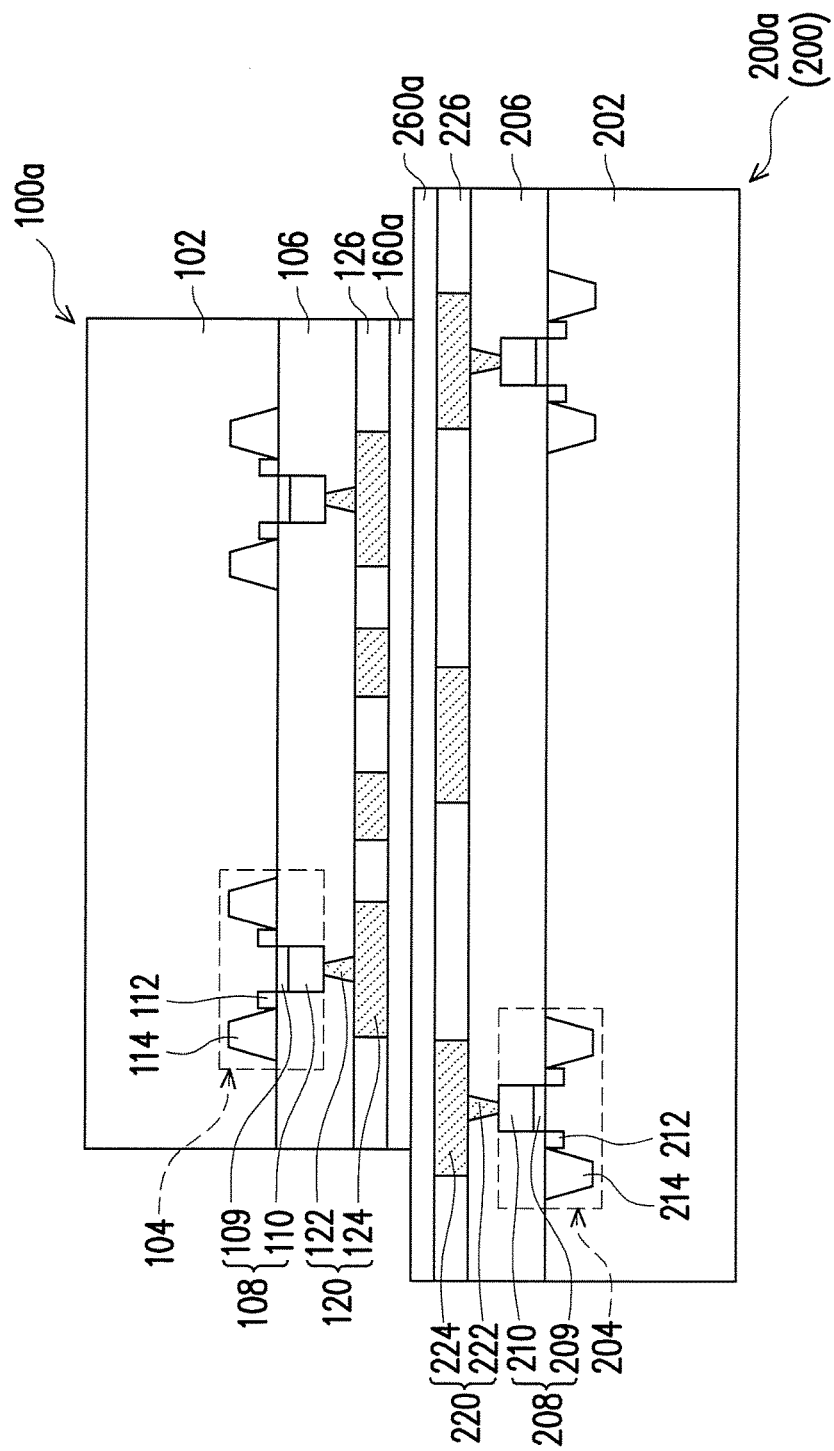
Figure 5G:
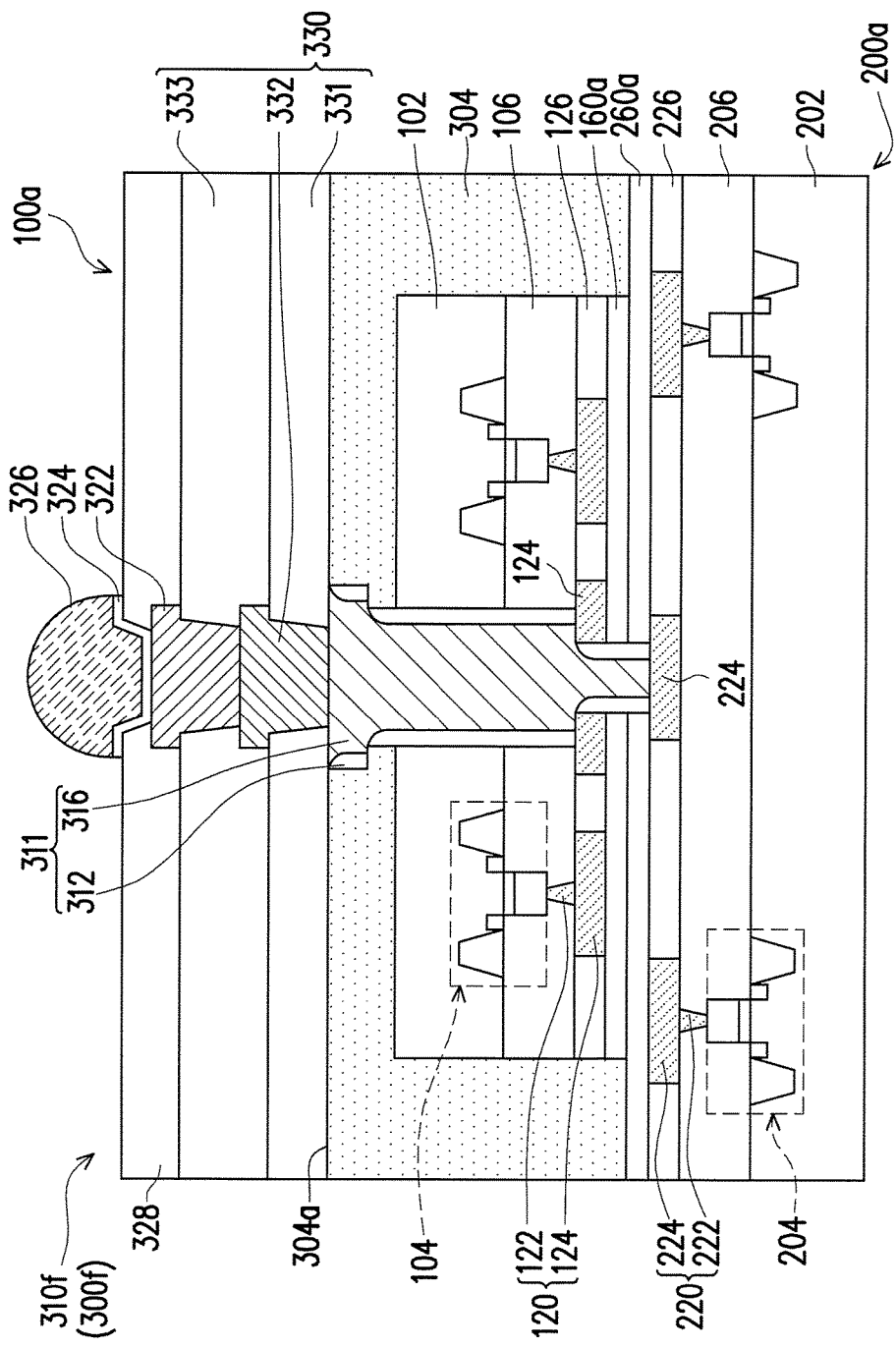

Referring to FIG. 5F and FIG. 5G and FIG. 6, step S14 through step 16, are performed according to methods described in the first embodiments to form a stack structure 300e. Thereafter, referring to FIG. 5G and FIG. 6, step S18, the stack structure 300e may be diced to form 3DIC structures 310e afterwards.

In the fifth embodiments, the process of manufacturing method may be reduced since the steps to form the test pads are omitted.

In view of the foregoing, the yield rate of the individual 3DIC of the disclosure is improved since the die performance test and selection are completed before dicing. Furthermore, in the first embodiments, the flat topography of the bonding layer may improve the bonding strength. Also, in some embodiments, compared to the traditional manufacturing process, photomasks for patterning the test pads or additional passivation layers are omitted to reduce the manufacturing process and process costs. In some embodiments, since the test pads and the redistributions lines may be formed in the same time, the process of manufacturing method may be reduced, and further, the space utilization is improved.

In accordance with some embodiments of the present disclosure, a 3DIC structure includes a first die, a through substrate via and a connector. The first die is bonded to a second die with a first dielectric layer of the first die and a second dielectric layer of the second die, wherein a first passivation layer is between the first dielectric layer and a first substrate of the first die, and a first test pad is embedded in the first passivation layer. The through substrate via penetrates through the first die and is electrically connected to the second die. The connector is electrically connected to the first die and the second die through the through substrate via.

In accordance with alternative embodiments of the present disclosure, a 3DIC structure includes a first die, a through substrate via and a connector. The first die is bonded to a second die with a first dielectric layer of the first die and a second dielectric layer of the second die, wherein a first passivation layer is between the first dielectric layer and a first substrate of the first die, and a first test pad is formed in the first passivation layer and extending to the first dielectric layer. The through substrate via penetrates through the first die and is electrically connected to the second die. The connector is electrically connected to the first die and the second die through the through substrate via.

In accordance with some embodiments of the present disclosure, a method of manufacturing a 3DIC structure includes followings. A die performance test is conducted to a first metallization structure of a first semiconductor wafer and a second metallization structure of a second semiconductor wafer to identify a first die and a second die, wherein the first die and the second die are known good dies. A first dielectric layer is formed on the first semiconductor wafer, and a second dielectric layer is formed on the second semiconductor wafer. The first die is picked up to bond to the second die with the first dielectric layer and the second dielectric layer. A connector is formed to electrically connect to the first die and the second die with a through substrate via so as to form a stack structure. The stack structure is diced to form the three dimensional integrated circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three dimensional integrated circuit structure, comprising:
   a first die bonded to a second die with a first dielectric layer of the first die and a second dielectric layer of the second die, wherein a first passivation layer is between the first dielectric layer and a first substrate of the first die, and a first test pad is formed in the first passivation layer and extending to the first dielectric layer;
   first redistribution lines embedded in the first dielectric layer;
   a through substrate via penetrating through the first die and electrically connected to the second die; and
   a connector electrically connected to the first die and the second die through the through substrate via.

2. The three dimensional integrated circuit structure according to claim 1, wherein the first test pad has a probe mark therein.

3. The three dimensional integrated circuit structure according to claim 1, wherein a material of the first test pad is softer than a material of a first interconnection, and the first interconnection is between the first test pad and the first substrate.

4. The three dimensional integrated circuit structure according to claim 3, wherein the material of the first test pad comprises aluminum, and the material of the first interconnection comprises copper, copper alloys, nickel, aluminum, tungsten or a combination thereof.

5. The three dimensional integrated circuit structure according to claim 1, wherein the first die and the second die are face-to-face bonded together.

6. The three dimensional integrated circuit structure according to claim 1, wherein a second passivation layer is between the second dielectric layer and a second substrate of the second die, and a second test pad is formed in the second passivation layer and extending to the second dielectric layer.

7. The three dimensional integrated circuit structure according to claim 6, further comprising second redistribution lines embedded in the second dielectric layer.

8. The three dimensional integrated circuit structure according to claim 6, wherein a material of the second test pad is softer than a material of a second interconnection, and the second interconnection is between the second test pad and the second substrate.

9. The three dimensional integrated circuit structure according to claim 8, wherein the material of the second test pad comprises aluminum, and the material of the second interconnection comprises copper, copper alloys, nickel, aluminum, tungsten or a combination thereof.

10. The three dimensional integrated circuit structure according to claim 1, wherein each of the first dielectric layer and the second dielectric layer have a flat surface.

11. A three dimensional integrated circuit structure, comprising:
a first die bonded to a second die,
wherein the first die comprises:
a first flat dielectric layer, formed over a first substrate;
a first passivation layer, formed between the first flat dielectric layer and the first substrate;
a first test pad, formed in the first passivation layer and extending to the first flat dielectric layer, wherein the first test pad has a probe mark therein;
first redistribution lines, adjacent to the first test pad and formed over the first passivation layer;
a first interconnection, connected with the first test pad and the first substrate, and wherein a material of the first test pad is softer than a material of the first interconnection;
wherein the second die comprises:
a second flat dielectric layer, formed over a second substrate, the first die bonded to the second die with the first flat dielectric layer and the second flat dielectric layer;
a through substrate via penetrating through the second substrate and electrically connected to the first interconnection; and
a connector electrically connected to the first die and the second die through the through substrate via.

12. The three dimensional integrated circuit structure according to claim 11, wherein the first die and the second die are face-to-face bonded together.

13. The three dimensional integrated circuit structure according to claim 11, wherein the material of the first test pad comprises aluminum, and the material of the first interconnection comprises copper, copper alloys, nickel, aluminum, tungsten or a combination thereof.

14. A three dimensional integrated circuit structure, comprising:
a first die bonded to a second die with a first dielectric layer of the first die and a second dielectric layer of the second die, wherein the first dielectric layer covers top surfaces and sidewalls of a first aluminum pad and first redistribution lines of the first die and the second dielectric layer covers top surfaces and sidewalls of a second aluminum pad and second redistribution lines of the second die, wherein each of the first aluminum pad and the second aluminum pad has a probe mark therein, and the first dielectric layer and the second dielectric layer further cover each of the probe mark.

15. The three dimensional integrated circuit structure according to claim 14, wherein the first redistribution lines and the second redistribution lines comprise copper, copper alloys, nickel, aluminum, tungsten or a combination thereof.

16. The three dimensional integrated circuit structure according to claim 14, wherein
the first die further comprises a first passivation layer, located between the dielectric layer and a first substrate, wherein a portion of the first aluminum pad is formed in the first passivation layer; and
the second die further comprises a second passivation layer, located between the dielectric layer and a second substrate, wherein a portion of the second aluminum pad is formed in the second passivation layer.

17. The three dimensional integrated circuit structure according to claim 16, wherein another portion of the first aluminum pad and the first redistribution lines are located on the first passivation layer, and another portion of the second aluminum pad and the second redistribution lines are located on the second passivation layer.

18. The three dimensional integrated circuit structure according to claim 14, wherein each of the first aluminum pad and the second aluminum pad has a recess region on top surfaces thereof, and the probe mark is formed in the recess region.

19. The three dimensional integrated circuit structure according to claim 14, further comprising:
a through substrate via penetrating through the first die and electrically connected to the second die; and
a connector electrically connected to the first die and the second die through the through substrate via.

* * * * *